(12) United States Patent
Igo et al.

(10) Patent No.: US 7,772,573 B2
(45) Date of Patent: Aug. 10, 2010

(54) ION IMPLANTING APPARATUS AND METHOD OF CORRECTING BEAM ORBIT

(75) Inventors: Tetsuya Igo, Kyoto (JP); Takatoshi Yamashita, Kyoto (JP); Tadashi Ikejiri, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 0 days.

(21) Appl. No.: 12/476,836

(22) Filed: Jun. 2, 2009

(65) Prior Publication Data
US 2009/0302214 A1    Dec. 10, 2009

(30) Foreign Application Priority Data
Jun. 6, 2008    (JP)    ............... 2008-149162

(51) Int. Cl.
G21K 5/10    (2006.01)
H01J 49/00    (2006.01)
B01D 59/44    (2006.01)

(52) U.S. Cl. .................. 250/492.21; 250/281; 250/282; 250/288; 250/492.1; 250/492.3; 250/397

(58) Field of Classification Search ............ 250/492.21, 250/281, 282, 288, 492.1, 492.3, 397
See application file for complete search history.

(56) References Cited

U.S. PATENT DOCUMENTS 7,351,987 B2 * 4/2008 Kabasawa et al. ...... 250/492.21
7,361,892 B2 * 4/2008 Kabasawa et al. ........... 250/290
2010/0051825 A1 * 3/2010 Yamashita et al. ...... 250/423 R

FOREIGN PATENT DOCUMENTS

JP    2008-27845    2/2008

* cited by examiner

Primary Examiner—Nikita Wells
(74) Attorney, Agent, or Firm—Osha • Liang LLP

(57) ABSTRACT

An extraction electrode of an ion source is dividedly configured by a first extraction electrode and a second extraction electrode. DC power supplies which form a potential difference between the electrodes, a camera which takes an image of the ion beam to output image data of the ion beam, and a rear-stage beam instrument which measures the beam current of the ion beam that has passed through the analysis slit are disposed. A step of adjusting an analysis electromagnet current so that the beam current measured by the rear-stage beam instrument is maximum, that of processing the image data from the camera to obtain the deviation angle of the ion beam entering the analysis slit from the design beam orbit, and that of, if the deviation angle is not within an allowable range, adjusting the potential difference between the electrodes so that the ion beam is bent to a direction where the deviation angle becomes small, by the potential difference are performed one or more times until the deviation angle is within the allowable range.

8 Claims, 20 Drawing Sheets

ION IMPLANTING APPARATUS AND METHOD OF CORRECTING BEAM ORBIT

This application claims priority from Japanese Patent Application No. 2008-149162, filed on Jun. 6, 2008, the entire contents of which are hereby incorporated by reference.

FIELD OF THE INVENTION

The present disclosure relates to an ion implanting apparatus in which a ribbon-like (this is also called a sheet-like or a strip-like, the same shall apply hereinafter) ion beam extracted from an ion source is subjected to an momentum analysis (such as a mass analysis, the same shall apply hereinafter), and is then incident on a target, and also to a method of correcting a beam orbit where the orbit of an ion beam is corrected so that a deviation angle of the ion beam entering an analysis slit is reduced.

DESCRIPTION OF RELATED ART

FIG. 18 shows a related art example of an ion implanting apparatus.

It is assumed that a design traveling direction of an ion beam 2 is set as a Z direction, and two directions that are substantially perpendicular to each other in a plane that is substantially perpendicular to the Z direction are set as X and Y directions, respectively. The ion implanting apparatus includes: an ion source 10 from which a ribbon-like ion beam 2 in which the dimension in the Y direction is larger than that in the X direction is extracted; an analysis electromagnet 30 which, in an XZ plane, bends the ion beam 2 extracted from the ion source 10, by a magnetic field B to perform an momentum analysis; and an analysis slit 40 which is disposed downstream of the analysis electromagnet 30 to cooperate with the analysis electromagnet 30 to perform an momentum analysis of the ion beam 2. The ion implanting apparatus is configured so that the ion beam 2 which has passed through the analysis slit 40 is caused to be incident on a target 6. In the specification, an example in which ions constituting the ion beam 2 are positive ions will be described.

FIG. 19 shows an example of the ribbon-like ion beam 2 where the dimension $W_Y$ in the Y direction is larger than the dimension $W_X$ in the X direction. In the figures except FIGS. 19, 3, 5, and 16, in order to simplify and clarify the illustration thereof, the ion beam 2 in the XZ plane is indicated by a line.

The ion source 10 has: a plasma generating chamber 12 in which a plasma 14 is generated; an extraction electrode system 20 which extracts the ion beam 2 from the plasma 14 in the plasma generating chamber 12 by a function of an electric field; and a magnet 16 which applies a magnetic field 18 that extends along the Y direction into the plasma generating chamber 12.

Although, in order to simplify the illustration, the extraction electrode system 20 in FIG. 18 is indicated by one electrode, such a system often has a plurality of electrodes arranged in the extraction direction of the ion beam. Each of the electrodes has a slit-like opening which extends in, for example, the Y direction.

Although the illustration is simplified in FIG. 18 and the like, the magnet 16 has magnetic poles which vertically sandwiches the plasma generating chamber 12 in the Y direction. For example, the magnet 16 is an electromagnet, or alternatively may be a permanent magnet. In the illustrated example, the direction of the magnetic field 18 is oriented from a reverse side of a sheet of the description to a front side of the sheet. Alternatively, the direction may be opposite to the illustrated one.

As described also in a Japanese Unexamined Patent Application Publication No. JP-A-2008-27845, for example, the magnetic field 18 performs functions of confining electrons in the plasma generating chamber 12, preventing the electrons from colliding against a wall of the plasma generating chamber 12, and enhancing an efficiency of ionizing a source gas which is introduced into the plasma generating chamber 12, thereby increasing a plasma density.

A DC analysis electromagnet power source 32 supplies to the analysis electromagnet 30 an analysis electromagnet current $I_3$ for energizing the electromagnet. In the illustrated example, a direction of the magnetic field B is oriented from the reverse side of the sheet to the front side. The analysis slit 40 has a slit-like opening 42 which extends in the Y direction.

The ion beam 2 which has passed through the analysis slit 40 is incident on a target (for example, a semiconductor substrate) 6 held by a holder 8, thereby implanting ions into the target 6. As indicated by an arrow A in FIG. 18, for example, the holder 8 and the target 6 are mechanically driven (scanned) by a target driving device which is not shown, in a direction intersecting with the principal face 3 (see FIG. 19) of the ribbon-like ion beam 2, whereby ion implantation can be performed on the whole surface of the target 6.

As described above, the magnetic field 18 in the ion source that extends along the Y direction is effective in enhancing the plasma density in the plasma generating chamber 12. However, the magnetic field 18 extends to the extraction electrode system 20, and there arises a problem in that the ion beam 2 extracted from the ion source 10 (more specifically, the extraction electrode system 20 of the ion source) is bent by an influence of the magnetic field 18 and an emission direction of the ion beam 2 is changed.

The problem will be described with reference to FIG. 20. When the magnetic field 18 affects the ion beam 2 extracted from the plasma generating chamber 12, the Lorentz force F acts on the ion beam 2, so that, as shown in FIG. 20, the actual ion beam 2 is emitted in a direction shifted from a design beam orbit 4.

Elements of the beam optical system such as the analysis electromagnet 30 and the analysis slit 40 which are disposed on the downstream side (the downstream side in the traveling direction of the ion beam 2, the same shall apply hereinafter) of the ion source 10 are usually designed and produced under the assumption that the ion beam 2 emitted from the ion source 10 passes along the design beam orbit 4. When the direction of the ion beam 2 emitted from the ion source 10 functioning as the source is shifted as described above, therefore, it is difficult to efficiently transport the ion beam 2 to the target 6, and disadvantages such as that the efficiency of transporting the ion beam 2 is lowered occur.

In order to resolve the problem, the direction of the ion source 10 may be made variable and the above-described shift of the beam orbit may be corrected. However, most portions of the ion source 10 are placed in a vacuum atmosphere, and hence a moving mechanism for the ion source must have a bellows or the like so as to maintain the vacuum. Such a moving mechanism is complex in structure. Therefore, it is not practical to make the direction of the ion source variable.

SUMMARY OF INVENTION

Illustrative aspects of the present invention provide a method or apparatus in which, even in the case where the direction of an ion source is not variable, when the orbit of an ion beam emitted from the ion source is affected by a magnetic field extending in the Y direction in the ion source to be shifted from a design beam orbit, the orbit of the ion beam entering an analysis slit can be made close to the design beam orbit.

According to a first aspect of the invention, a method of correcting a beam orbit of the invention is provided with, an ion source from which, in a case where a design traveling direction of an ion beam is set as a Z direction, and two directions that are substantially perpendicular to each other in a plane that is substantially perpendicular to the Z direction are set as X and Y directions, respectively, a ribbon-like ion beam in which a dimension in the Y direction is larger than a dimension in the X direction is extracted, the ion source including: a plasma generating chamber in which a plasma is generated; an extraction electrode system which extracts an ion beam from the plasma in the plasma generating chamber by a function of an electric field, which has a plurality of electrodes in an ion beam extraction direction, and which some of the electrodes are set to a negative potential having an absolute value of 10 kV or higher with respect to a potential of the plasma generating chamber, an extraction electrode which is closest to the plasma is dividedly configured by first and second extraction electrodes which are on both sides of a path of the ion beam in the X direction; and a magnet which applies a magnetic field that extends along the Y direction into the plasma generating chamber; the ion implanting apparatus further including: an analysis electromagnet which, in an XZ plane, bends the ion beam extracted from the ion source by a magnetic field to perform a momentum analysis; a DC analysis electromagnet power supply which supplies to the analysis electromagnet an analysis electromagnet current that energizes the analysis electromagnet; an analysis slit which is disposed downstream of the analysis electromagnet to cooperate with the analysis electromagnet to perform a momentum analysis of the ion beam; a voltage-variable DC power supply which can form a potential difference between the first and second extraction electrodes; a front-stage beam instrument which receives the ion beam between the analysis electromagnet and the analysis slit, to measure a beam current density distribution in the X direction; and a rear-stage beam instrument which receives the ion beam that has passed through the analysis slit, to measure a current of the ion beam, wherein the ion beam which has passed through the analysis slit is caused to be incident on a target. The method is provided with: an analysis electromagnet current adjusting step of adjusting the analysis electromagnet current so that the beam current measured by the rear-stage beam instrument is maximum; a deviation angle measuring step of measuring a center position of the ion beam in the X direction by using the front-stage beam instrument, and, by using the center position and a distance between the front-stage beam instrument and the analysis slit, obtaining a deviation angle of an actual beam orbit of the ion beam entering the analysis slit, from a design beam orbit in the XZ plane; and a potential difference adjusting step of determining whether the deviation angle measured in the deviation angle measuring step is within a threshold allowable range or not, and, if not within the allowable range, adjusting the potential difference by using the DC power supply so that, when the ion beam leaves the extraction electrode system, the ion beam is bent by the potential difference between the first and second extraction electrodes, in a direction along which the deviation angle is reduced, wherein the method performs one or more times until the deviation angle measured in the deviation angle measuring step is within the threshold allowable range.

According to the method of correcting a beam orbit, the ion beam is deflected by the potential difference between the first and second extraction electrodes constituting the extraction electrode system of the ion source, toward the electrode of the lower potential, whereby the direction of the ion beam emitted from the ion source can be changed. Therefore, it is not required to make the direction of the ion source variable.

Moreover, the analysis electromagnet current adjusting step, the deviation angle measuring step, and the potential difference adjusting step are performed one or more times until the deviation angle measured in the deviation angle measuring step is within the threshold allowable range, whereby, even when the orbit of the ion beam emitted from the ion source is affected by the magnetic field extending in the Y direction in the ion source to be shifted from the design beam orbit, the orbit of the ion beam entering the analysis slit can be corrected so as to be made close to the design beam orbit.

In place of the front-stage beam instrument, a camera which takes an image of the ion beam in the XZ plane in a region from the analysis slit to the upstream side of the analysis slit, and which outputs image data of the ion beam may be disposed, and, in the deviation angle measuring step, the image data from the camera may be processed to obtain a deviation angle of an actual beam orbit of the ion beam entering the analysis slit, from a design beam orbit in the XZ plane.

A configuration may be employed where, when, with respect to the design beam orbit which extends in the XZ plane from the ion source to the analysis slit through an arcuate orbit in the analysis electromagnet, a side toward a center of the arc is referred to as an inner side, and a side opposite to the inner side is referred to as an outer side, the first extraction electrode is located in the inner side, and the second extraction electrode is located in the outer side, when the deviation angle is an angle in the outer side with respect to the design beam orbit, the potential difference is adjusted in the potential difference adjusting step so that a potential of the second extraction electrode is higher than a potential of the first extraction electrode, and, when the deviation angle is an angle in the inner side with respect to the design beam orbit, the potential difference is adjusted in the potential difference adjusting step so that the potential of the first extraction electrode is higher than the potential of the second extraction electrode.

According to a second aspect of the invention, an ion implanting apparatus is provided with an ion source from which, in a case where a design traveling direction of an ion beam is set as a Z direction, and two directions that are substantially perpendicular to each other in a plane that is substantially perpendicular to the Z direction are set as X and Y directions, respectively, a ribbon-like ion beam in which a dimension in the Y direction is larger than a dimension in the X direction is extracted, the ion source including: a plasma generating chamber in which a plasma is generated; an extraction electrode system which extracts an ion beam from the plasma in the plasma generating chamber by a function of an electric field, which has a plurality of electrodes in an ion beam extraction direction, and which some of the electrodes are set to a negative potential having an absolute value of 10 kV or higher with respect to a potential of the plasma generating chamber, an extraction electrode which is closest to the plasma is dividedly configured by first and second extraction electrodes which are on both sides of a path of the ion beam in the X direction; and a magnet which applies a magnetic field that extends along the Y direction into the plasma generating chamber. The ion implanting apparatus is further provided with: an analysis electromagnet which, in an XZ plane, bends the ion beam extracted from the ion source by a magnetic field to perform a momentum analysis; a DC analysis electromagnet power supply which supplies to the analysis electromagnet an analysis electromagnet current that energizes the analysis electromagnet; an analysis slit which is disposed downstream of the analysis electromagnet to cooperate with the analysis electromagnet to perform a momentum analysis of the ion beam; a voltage-variable DC power supply which can form a potential difference between the first and second extraction electrodes; a front-stage beam instrument which receives the ion beam between the analysis electromagnet and the analysis slit, to measure a beam current density distribution in the X direction; a rear-stage beam instrument which receives the ion beam that has passed through the analysis slit, to measure a current of the ion beam; and a controlling device which performs one or more times: (a) an analysis electromagnet current adjusting control where the analysis electromagnet power supply is controlled to adjust the analysis electromagnet current so that the beam current measured by the rear-stage beam instrument is maximum; (b) a deviation angle measuring control where a center position of the ion beam in the X direction is obtained by using measurement information supplied from the front-stage beam instrument, and, by using the center position and a distance between the front-stage beam instrument and the analysis slit, a deviation angle of an actual beam orbit of the ion beam entering the analysis slit from a design beam orbit in the XZ plane is obtained; and (c) a potential difference adjusting control where it is determined whether the deviation angle measured in the deviation angle measuring control is within a threshold allowable range or not, and, if not within the allowable range, the DC power supply is controlled to adjust the potential difference so that, when the ion beam leaves the extraction electrode system, the ion beam is bent by the potential difference between the first and second extraction electrodes, in a direction along which the deviation angle is reduced, until the deviation angle measured in the deviation angle measuring control is within the threshold allowable range.

In place of the front-stage beam instrument, a camera which takes an image of the ion beam in the XZ plane in a region from the analysis slit to the upstream side of the analysis slit, and which outputs image data of the ion beam may be disposed, and, in the deviation angle measuring step, the image data from the camera may be processed to obtain a deviation angle of an actual beam orbit of the ion beam entering the analysis slit, from a design beam orbit in the XZ plane.

A configuration may be employed where, when, with respect to the design beam orbit which extends from the ion source to the analysis slit through an arcuate orbit in the analysis electromagnet in the XZ plane, a side toward a center of the arc is referred to as an inner side, and a side opposite to the inner side is referred to as an outer side, the first extraction electrode is located in the inner side, and the second extraction electrode is located in the outer side, and, in the potential difference adjusting control, the controlling device adjusts the potential difference so that, when the deviation angle is an angle in the outer side with respect to the design beam orbit, a potential of the second extraction electrode is higher than a potential of the first extraction electrode, and, when the deviation angle is an angle in the inner side with respect to the design beam orbit, the potential of the first extraction electrode is higher than the potential of the second extraction electrode.

DETAILED DESCRIPTION OF EXEMPLARY EMBODIMENTS

Figure 1:
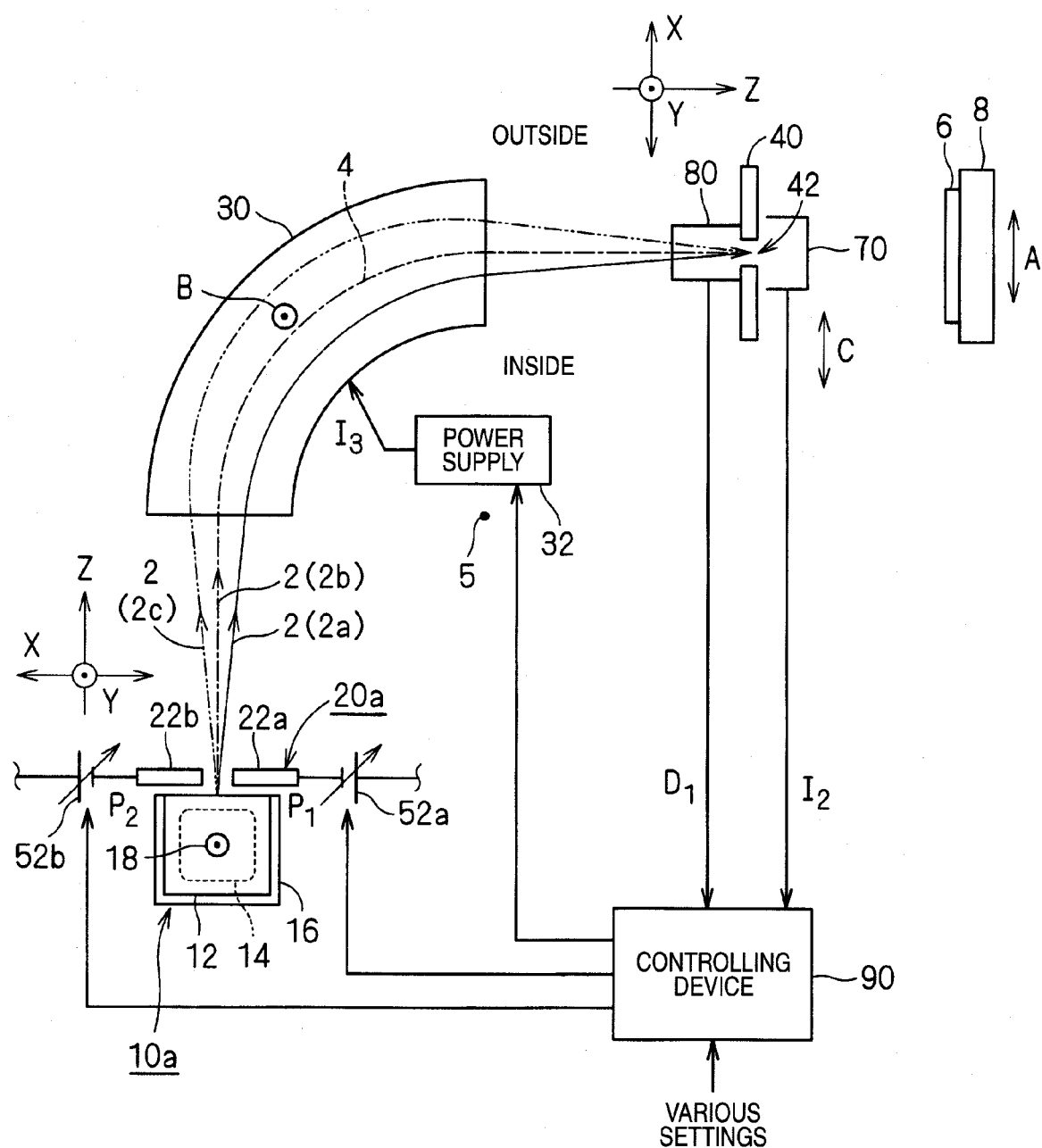
FIG. 1 is a schematic plan view showing a first exemplary embodiment of an ion implanting apparatus for performing a method of correcting a beam orbit of the invention.
Figure 2:
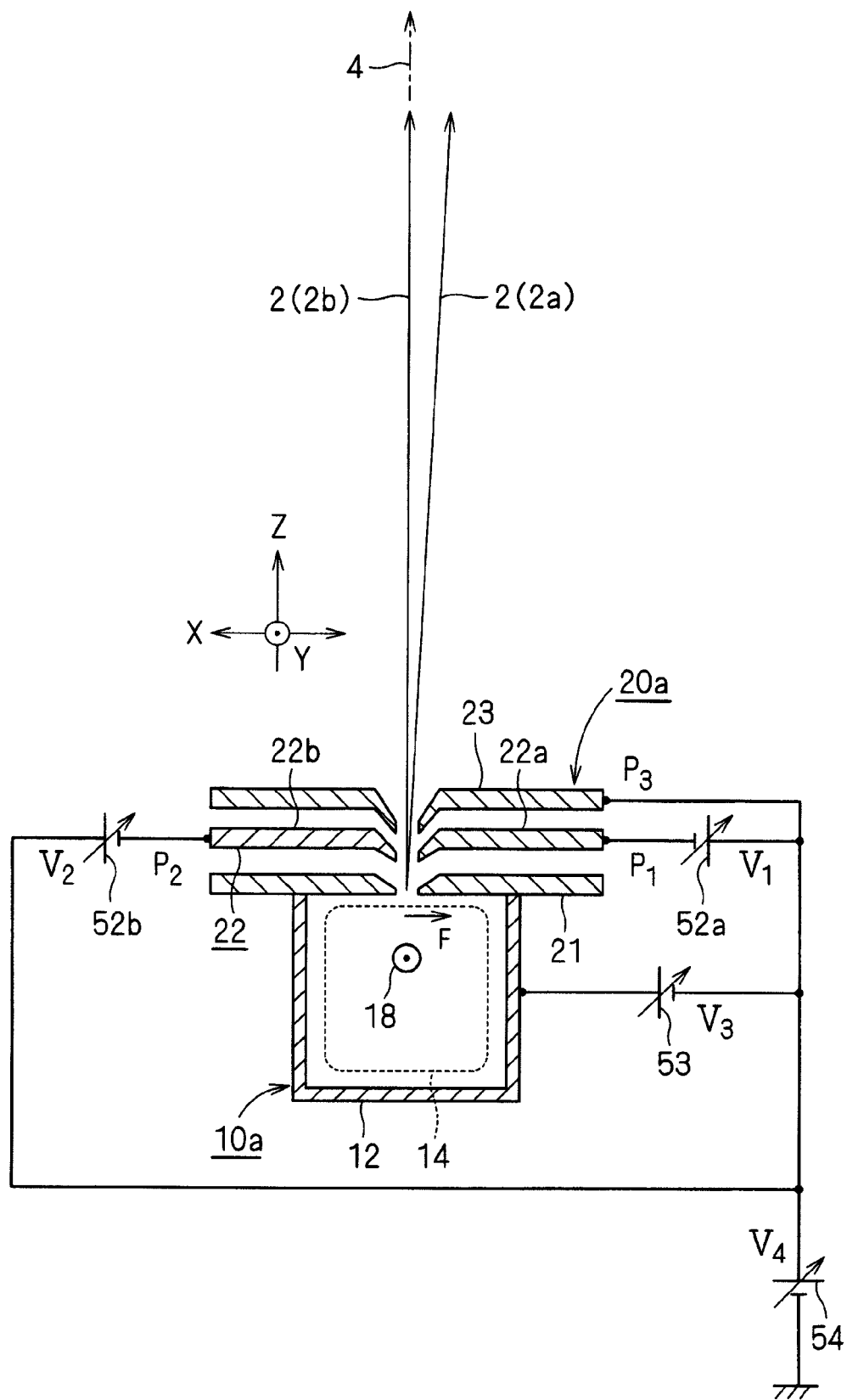
FIG. 2 is a view showing a more detailed example of an ion source in FIG. 1 and a power supply for the ion source.
Figure 3:
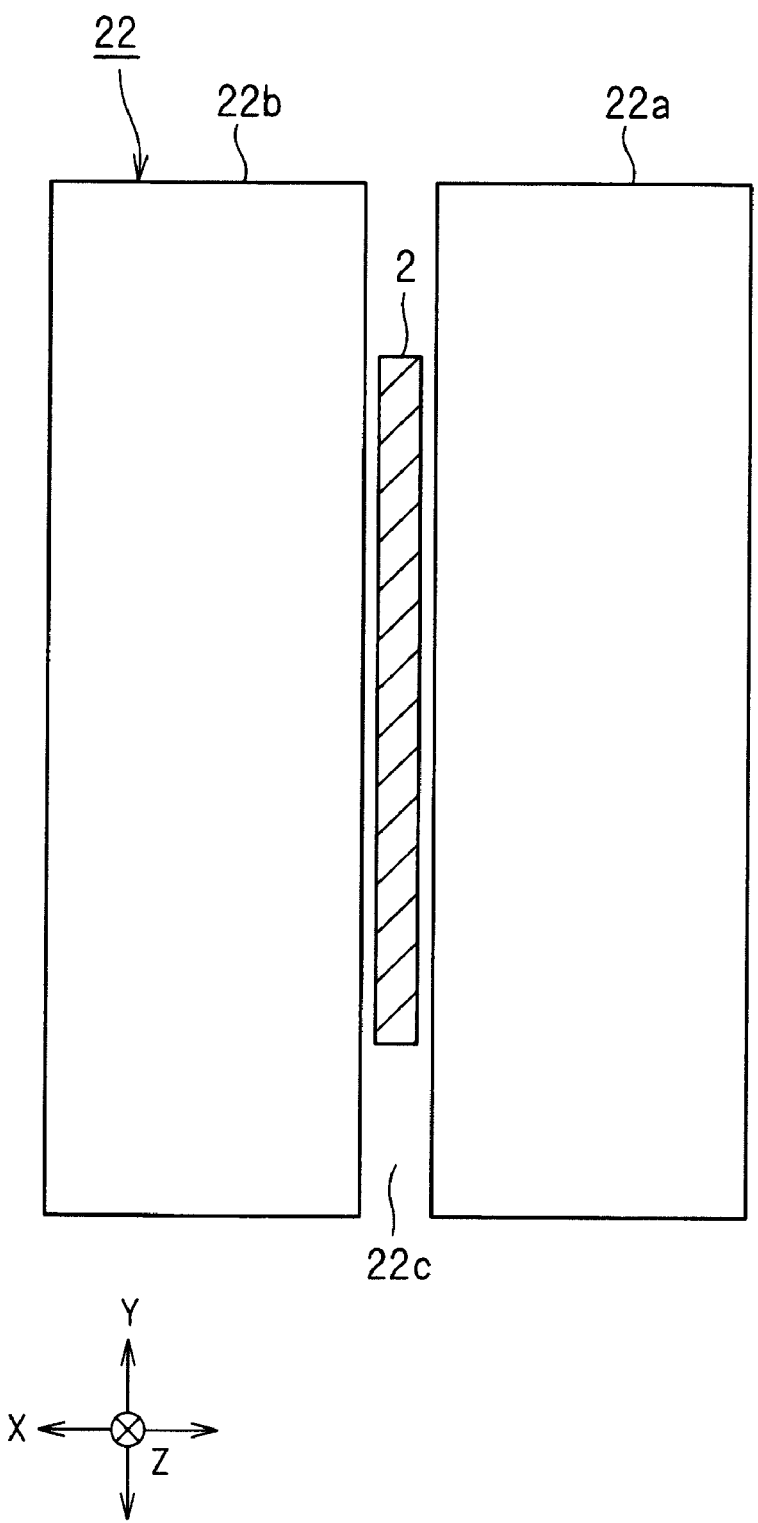
FIG. 3 is a front view schematically showing extraction electrodes in FIGS. 1 and 2, as viewed in an ion beam traveling direction.
Figure 18:
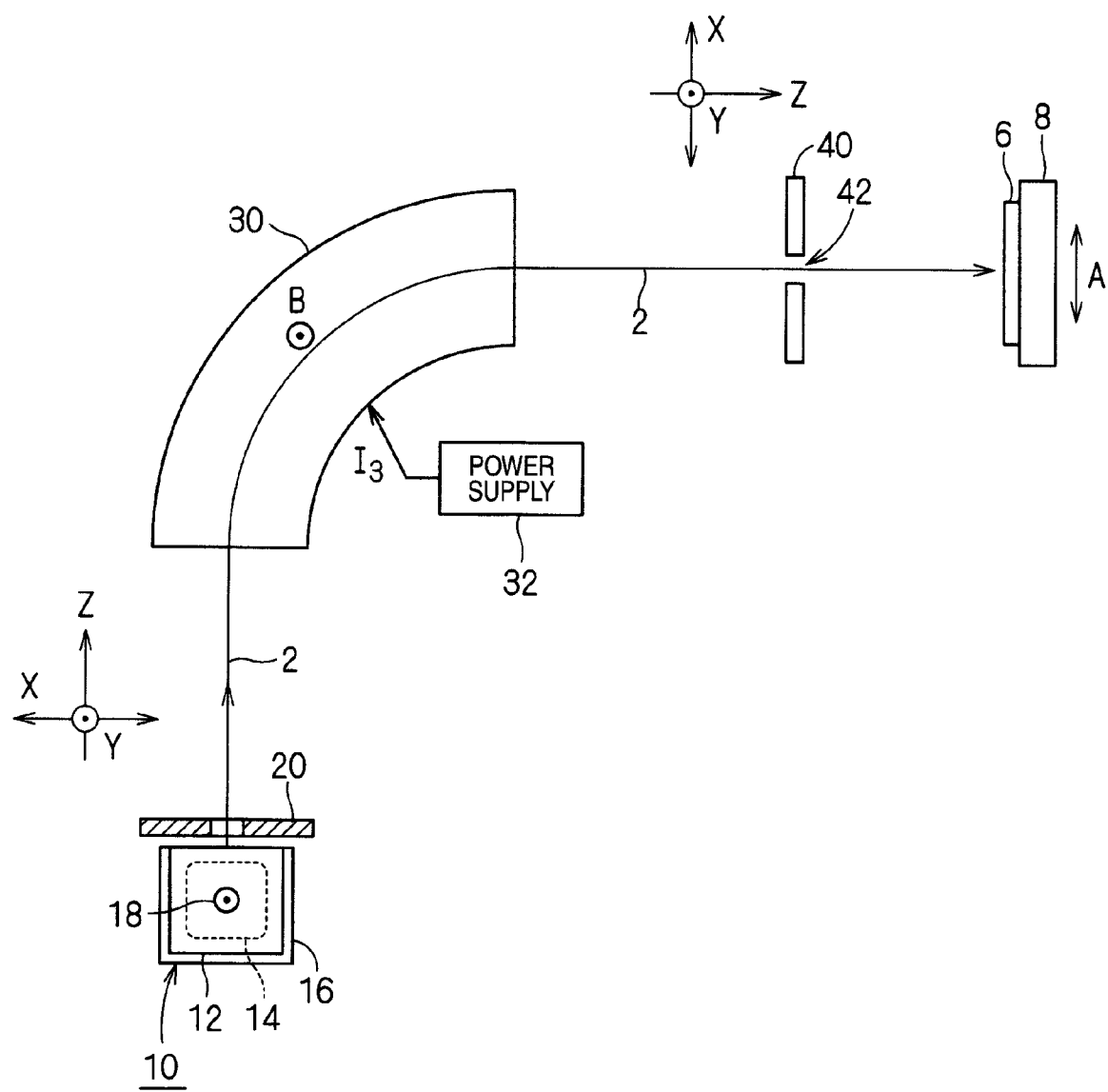
FIG. 18 is a schematic plan view showing an example of an ion implanting apparatus of the related art.
Figure 19:
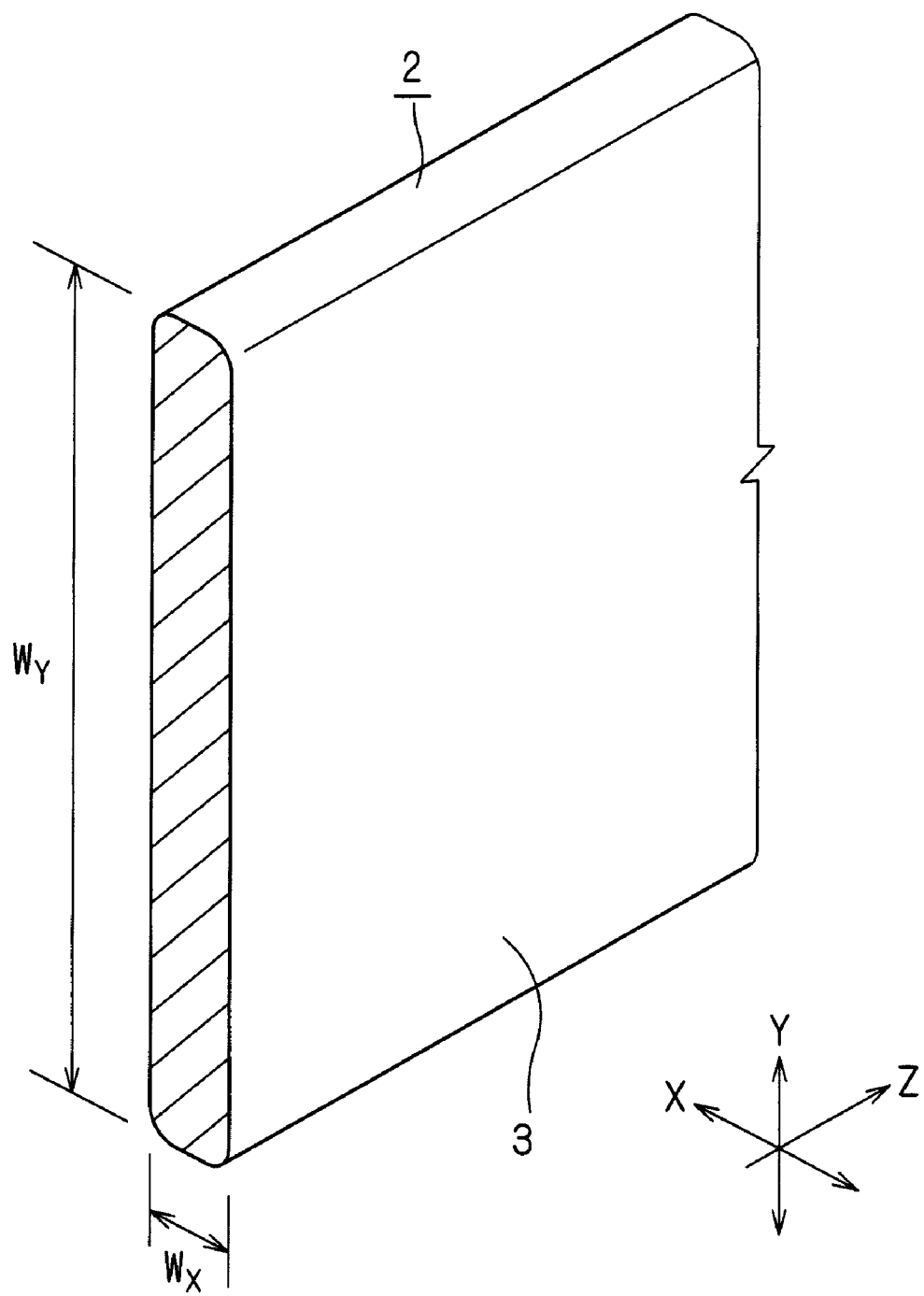
FIG. 19 is a schematic perspective view partially showing an example of a ribbon-like ion beam.
Figure 20:
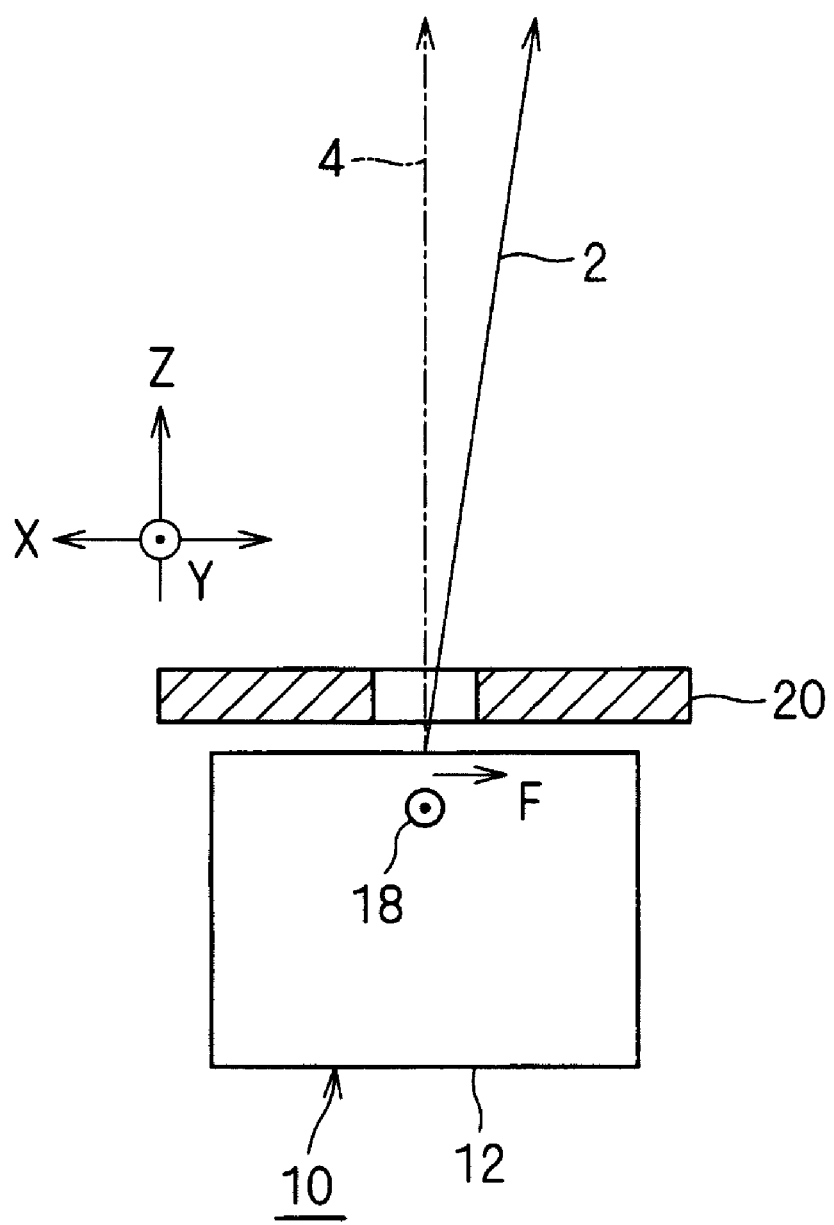
FIG. 20 is a view showing an example of a state where the emission angle of an ion beam which is extracted from an ion source by a magnetic field extending in the Y direction is changed.

FIG. 1 is a schematic plan view showing a first exemplary embodiment of an ion implanting apparatus for performing a method of correcting a beam orbit of the invention, FIG. 2 is a view showing a more detailed example of an ion source in FIG. 1 and a power supply for the ion source, and FIG. 3 is a front view schematically showing extraction electrodes in FIGS. 1 and 2, as viewed in an ion beam traveling direction. Portions which are identical or corresponding to those of the related art example shown in FIG. 18 are denoted by the same reference numerals, and, in the following description, emphasis is placed on differences from the related art example.

In addition to the analysis electromagnet 30, analysis electromagnet power supply 32, analysis slit 40, holder 8, and the like which have been described above, the ion implanting apparatus includes: an ion source 10a which is used in place of the above-described ion source 10; DC power supplies 52a, 52b for the ion source 10a; a camera 80 which takes an image of the ion beam 2 in the XZ plane in a region from the analysis slit 40 to an upstream side of the analysis slit 40, and which outputs image data $D_1$ of the ion beam 2; a rear-stage beam measuring instrument 70 which receives the ion beam 2 that has passed through the analysis slit 40, to measure a beam current $I_2$; and a controlling device 90 which performs a control that will be described later.

The ion source 10a has: a plasma generating chamber 12 into which a source gas (including the case of vapor) is introduced, and which ionizes the source gas to generate a plasma 14; an extraction electrode system 20a which extracts the ion beam 2 from the plasma 14 in the plasma generating chamber 12 by a function of an electric field; and a magnet 16 which applies a magnetic field 18 that extends along the Y direction in the plasma generating chamber 12. The magnet 16 is configured as described above.

The extraction electrode system 20a has a plurality of electrodes which are arranged in the extraction direction (i.e., the Z direction) of the ion beam 2. In the example, specifically, the extraction electrode system 20a has a plasma electrode 21, extraction electrode 22, and ground electrode 23 which are arranged as shown in FIG. 2 from a closest-plasma side (the side which is closest to the plasma 14, the same shall apply hereinafter) toward the downstream side, and each of which has a substantially plate-like shape. Each of the plasma electrode 21 and the ground electrode 23 is configured by a single electrode, and has a slit-like opening which extends in, for example, the Y direction, and through which the above-described ribbon-like ion beam 2 passes.

In the first exemplary embodiment, among extraction electrodes which are used for extracting the ion beam 2 from the plasma 14 in the plasma generating chamber 12, and which are set to a negative potential having an absolute value of 10 kV or higher with respect to the potential of the plasma generating chamber 12, the extraction electrode 22 is an electrode in the closest-plasma side. The extraction electrode 22 is dividedly configured by two electrodes which are on both sides of a path of the ion beam 2 in the X direction, i.e., a first extraction electrode 22a and second extraction electrode 22b. Each of the first extraction electrode 22a and the second extraction electrode 22b is a substantially plate-like electrode. As shown in FIG. 3, for example, a gap 22c through which the above-described ribbon-like ion beam 2 passes is formed between the electrodes 22a, 22b.

In FIGS. 1, and 7 to 15, in order to simplify the illustration, only the first extraction electrode 22a and the second extraction electrode 22b are shown as the electrodes constituting the extraction electrode system 20a.

An example of the power supply for the ion source 10a will be described with reference to FIG. 2.

In the example, the plasma generating chamber 12 and the plasma electrode 21 are electrically connected to each other, and are at the same potential.

A voltage-variable DC acceleration power supply 54 is connected between the ground electrode 23 and a ground potential portion, while setting the ground electrode 23 as the positive side. An output voltage of the power supply 54 is indicated by $V_4$. The ion beam 2 extracted from the ion source 10a can be accelerated to a desired energy by the voltage $V_4$. Therefore, the voltage $V_4$ is also called an acceleration voltage. As seen from the above description, the ground electrode 23 is not grounded in the example, but usually called a ground electrode.

Between the ground electrode 23 and the plasma generating chamber 12 (and the plasma electrode 21), a voltage-variable DC extraction power supply 53 is connected while the plasma generating chamber 12 is set as a positive side. An output voltage of the power supply 53 is indicated by $V_3$. The voltage $V_3$ extracts the ion beam 2 from the plasma 14 in the plasma generating chamber 12 by a function of the electric field. When the ion beam is extracted from the ion source 10a (specifically, the extraction electrode system 20a of the ion source), the energy of the ion beam 2 depends on the voltage $V_3$. Therefore, the voltage $V_3$ is also called an extraction voltage. Usually, the voltage $V_3$ is about 10 kV or higher, and, in a more specific example, about 15 to 35 kV.

Between the ground electrode 23 and the first and second extraction electrodes 22a, 22b, voltage-variable first and second DC power supplies 52a, 52b are respectively connected while the extraction electrodes 22a, 22b are set as a negative electrode. Output voltages of the DC power supplies 52a, 52b are indicated by $V_1$ and $V_2$, respectively. The DC power supplies 52a, 52b cause the electrodes 22a, 22b to have a negative potential with respect to the ground electrode 23, so that reverse electrons from the downstream side can be suppressed. When focused on the function of extracting the ion beam, the extraction electrode 22 is sometimes called an extraction electrode, and, when focused on the function of suppressing reverse electrons, the extraction electrode 22 is sometimes called a suppression electrode. For example, the voltages $V_1$, $V_2$ are about 1 to 5 kV.

When a potential is indicated with respect to the potential of the plasma generating chamber 12 and the plasma electrode 21, a potential $P_1$ of the first extraction electrode 22a, a potential $P_2$ of the second extraction electrode 22b, and a potential $P_3$ of the ground electrode 23 can be expressed by the following formulas, respectively. In order to extract the ion beam 2 from the plasma 14 in the plasma generating chamber 12, both the potentials $P_1$, $P_2$ are set to a negative potential having an absolute value of 10 kV or higher.

$$P_1 = -(V_3 + V_1)$$

$$P_2 = -(V_3 + V_2)$$

$$P_3 = -V_3 \quad \text{[Formula 1]}$$

When the output voltage $V_1$ of the DC power supply 52a and the output voltage $V_2$ of the DC power supply 52b are differentiated from each other, a potential difference $\Delta P$ can be formed between the first extraction electrode 22a and the second extraction electrode 22b. In the first exemplary embodiment, therefore, the DC power supplies 52a, 52b constitute a voltage-variable DC power supply which forms the potential difference ΔP. The potential difference ΔP can be expressed by the following formula.

$$\Delta P = P_1 - P_2 \qquad \text{[Formula 2]}$$
$$= V_2 - V_1$$

Although, in the above example, the number of the electrodes of the extraction electrode system 20a which are arranged in the ion beam extraction direction is three (three stages), the number is not restricted to this value. For example, the number may be two (two stages), or four (four stages) or more. In any number of electrodes, the invention is focused on the electrode in the closest-plasma side (in the example of FIG. 2, the extraction electrode 22) among electrodes which are used for extracting the ion beam 2 from the plasma 14 in the plasma generating chamber 12, and which are set to a negative potential having an absolute value of 10 kV or higher with respect to the potential of the plasma generating chamber 12. The reason why the attention is focused on the electrodes which are set to a negative potential having an absolute value of 10 kV or higher with respect to the potential of the plasma generating chamber 12 is that an electrode having such a potential can sufficiently achieve a function of extracting the ion beam 2 form the plasma 14 in the plasma generating chamber 12 by a function of the electric field. Although the electrode is sometimes called by another name such as an extraction electrode or a suppression electrode as described above, it is referred to as an extraction electrode in the specification. The configuration where, unlike the related art, the extraction electrode is dividedly configured by the first extraction electrode 22a and the second extraction electrode 22b as described above is one of the features of the invention.

Figure 4:
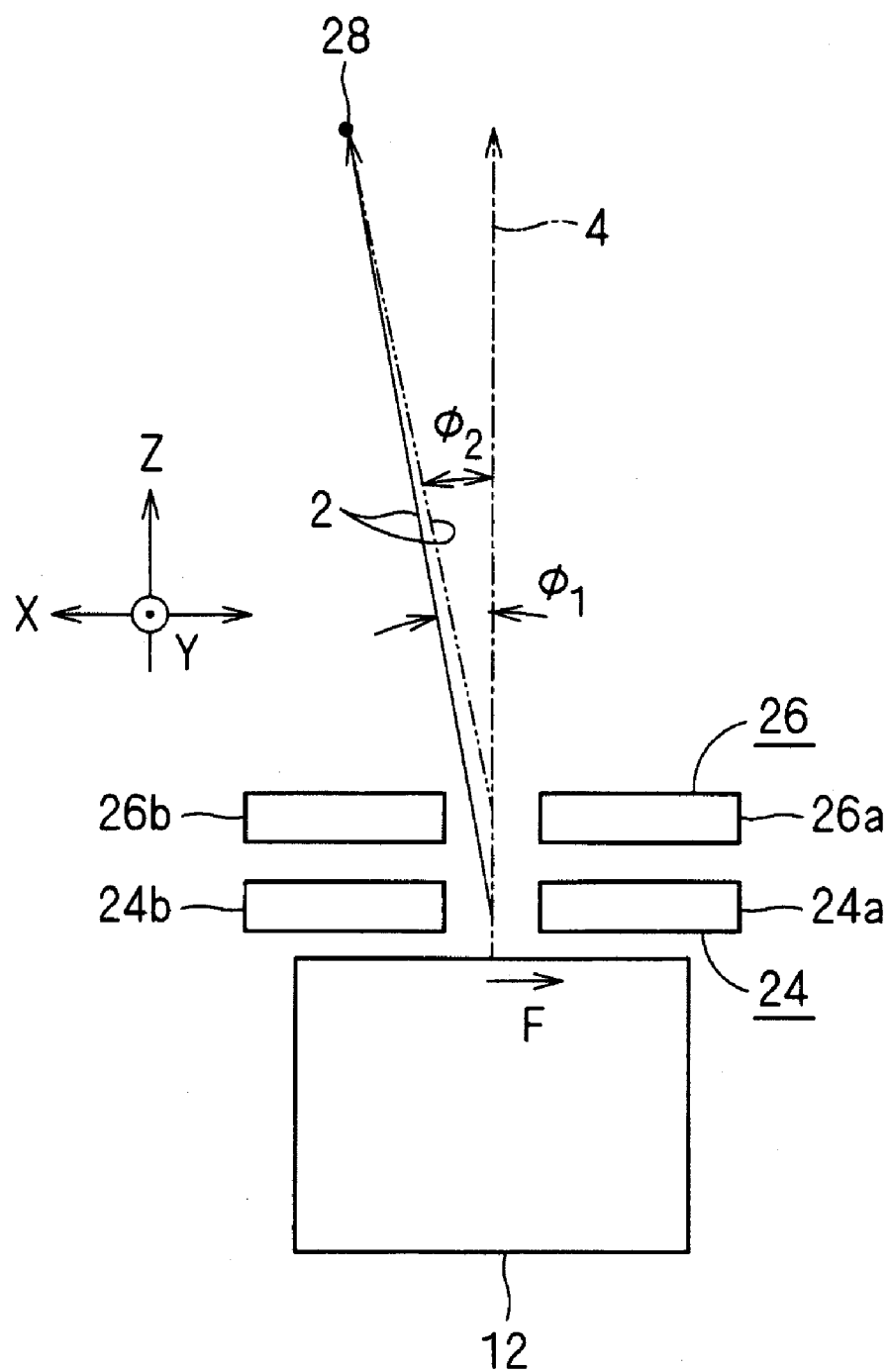
FIG. 4 is a schematic plan view illustrating a difference of a beam deflecting effect depending on positions of split electrodes constituting an extraction electrode system.

The reason why the attention is focused on the electrode in the closest-plasma side is as follows. For example, it is assumed that, as shown in FIG. 4, the electrodes which are set to a negative potential having an absolute value of 10 kV or higher with respect to the potential of the plasma generating chamber 12 are two electrodes 24, 26, and each of the electrodes 24, 26 is dividedly configured by first and second electrodes 24a, 24b or first and second electrodes 26a, 26b which are on both sides of the path of the ion beam 2 in the X direction, respectively. Also, it is assumed that the design beam orbit 4 of the ion beam 2 extracted from the plasma generating chamber 12 is perpendicular to the electrodes 24, 26, i.e., parallel to the Z axis.

In this case, when a potential difference is formed between the first and second electrodes 24a, 24b constituting the electrode 24, the ion beam 2 can be deflected by the potential difference. This function is applicable also to the electrode 26. The case where the ion beam 2 is deflected toward the same target point 28 is considered. As shown in FIG. 4, the deflection angle $\phi_1$ owing to the electrode 24 can be made smaller than the deflection angle $\phi_2$ owing to the electrode 26 because a distance between the electrode 24 and the target point 28 is longer than a distance between the electrode 26 and the target point 28.

In the case where the deflection is performed by the electrode 24, therefore, the potential difference between the first electrode (24a, 26a) and the second electrode (24b, 26b) is smaller than that in the case where the deflection is performed by the electrode 26. In other words, in the case where the deflection is performed by the electrode 24, a larger deflection is enabled by a smaller potential difference, and hence the controllability is more excellent. In the case where the ion beam 2 is bent back in a place which is as close as possible to that where the ion beam is bent by the above-mentioned Lorentz force F, the bending back operation can be controlled more easily. For these reasons, the electrode which is closest to the plasma among electrodes which are used for extracting the ion beam 2 from the plasma 14 in the plasma generating chamber 12, and which are set to a negative potential having an absolute value of 10 kV or higher with respect to the potential of the plasma generating chamber 12, i.e., the electrode in the closest-plasma side is preferably used for correcting the orbit of the ion beam 2. In the specification, such an electrode in the closest-plasma side is called the extraction electrode, and used for correcting the beam orbit.

Namely, the ion beam 2 is deflected toward the electrode of the lower potential by the potential difference ΔP between the potential $P_1$ of the first extraction electrode 22a constituting the extraction electrode system 20a and the potential $P_2$ of the second extraction electrode 22b also constituting the extraction electrode system 20a, whereby the direction of the ion beam 2 emitted from the ion source 10a can be changed. Referring to FIG. 2, when $P_2 < P_1$ is set, for example, the ion beam 2 can be deflected to the left side in FIG. 2, and, when $P_2 > P_1$ is set, the ion beam can be deflected to the right side in FIG. 2. Therefore, it is not required to make the direction of the ion source variable.

The orbit of the ion beam 2 in FIG. 2 is indicated on the basis of a result of a simulation which was actually performed. The simulation result will be described. In the case where orbits of the ion beam 2 are particularly distinguished from one another, the ion beam is indicated as ion beams 2a, 2b, 2c. The same is applicable also to the other figures.

In the simulation, in the state where the magnetic field 18 of $250 \times 10^{-4}$ [T] is generated in the plasma generating chamber 12 by the magnet 16 (see FIG. 1) of the ion source 10a, a plasma in which $B^+$ ions are present was produced in the plasma generating chamber 12. When the potential of the plasma generating chamber 12 and the plasma electrode 21 is used as a reference (the same is applicable also to the potentials $P_1$, $P_2$ which will be described later), the potential $P_3$ of the ground electrode 23 was set to −25 kV.

The ion beam 2a was obtained in the case where the $B^+$ ion beam was extracted while both the potentials $P_1$, $P_2$ of the first and second extraction electrodes 22a, 22b were set to −27 kV, respectively. The ion beam 2b was obtained in the case where the $B^+$ ion beam was extracted while the potential $P_1$ of the first extraction electrode 22a was set to −27 kV and the potential of the second extraction electrode 22b was set to −28.5 kV (i.e., $P_2 < P_1$ and the potential difference ΔP is 1.5 kV).

As described above, the Lorentz force F is caused to act on the ion beam 2 extracted from the plasma 14 in the plasma generating chamber 12 by the magnetic field 18. In the case where no potential difference exists between the first extraction electrode 22a and the second extraction electrode 22b, therefore, the orbit of the ion beam 2a has an angle of about 4 deg. with respect to the design beam orbit 4 in which deflection due to the Lorentz force F is assumed not to occur. By contrast, in the case where a potential difference ΔP of 1.5 kV is produced between the first extraction electrode 22a and the second extraction electrode 22b as described above, the orbit of the ion beam 2a is deflected toward the second extraction electrode 22b of the lower potential to substantially coincide with the design beam orbit 4.

The method of correcting a beam orbit of the invention uses the configuration where the potential difference ΔP is formed between the first extraction electrode 22a and the second extraction electrode 22b as described above, whereby the direction of the ion beam 2 emitted from the ion source 10a can be changed. The configuration will be described in detail.

Figure 5:
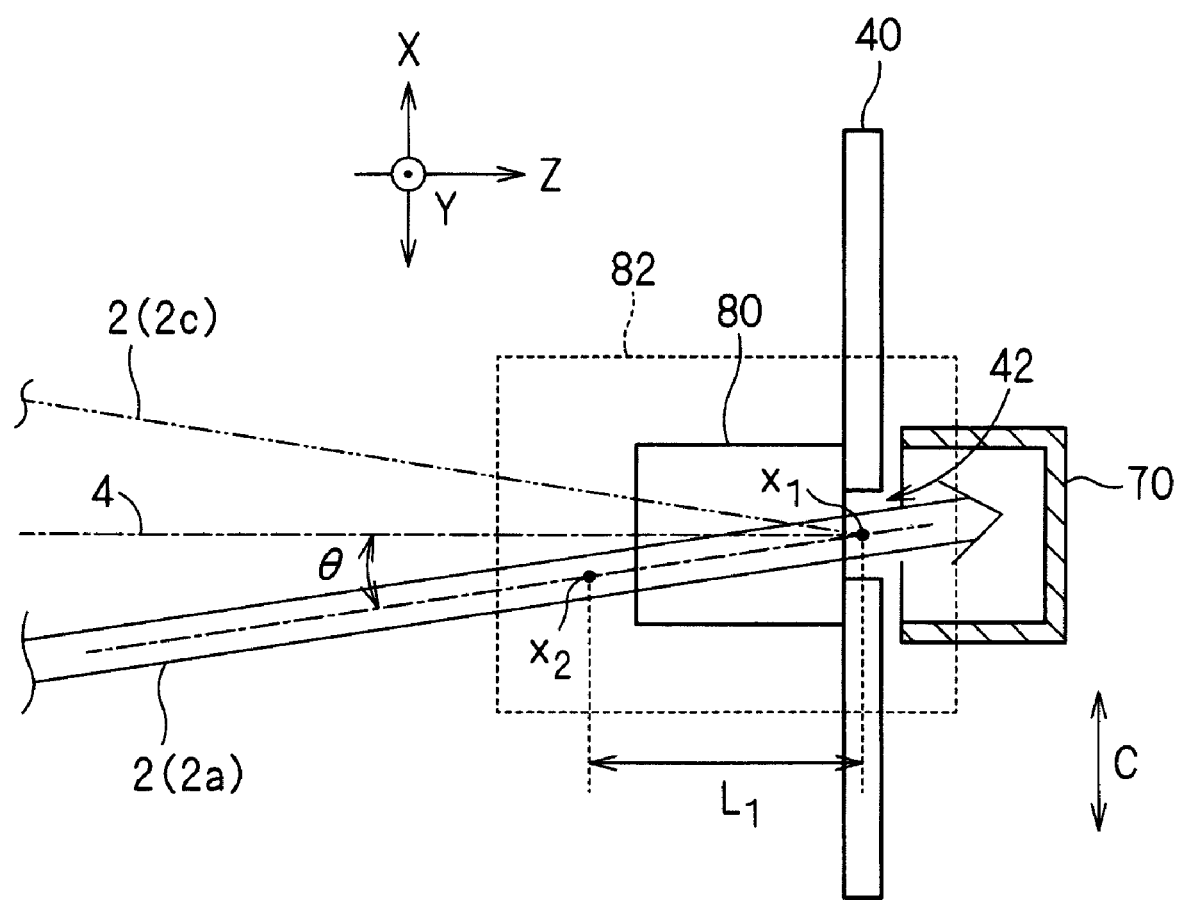
FIG. 5 is a plan view showing a detailed example of a vicinity of an analysis slit in FIG. 1.

Referring also to FIG. 5, in a vicinity of the downstream side of the analysis slit 40, the rear-stage beam measuring instrument 70 receives the ion beam 2 which has passed through the analysis slit 40, to measure the beam current $I_2$ of the ion beam 2. As indicated by an arrow C in FIG. 5, when the measurement is to be performed, for example, the rear-stage beam measuring instrument 70 is introduced into the path of the ion beam 2, and, when the ion implantation is to be performed on the target 6 (see FIG. 1), removed from the path of the ion beam 2. For example, the rear-stage beam measuring instrument 70 is a Faraday cup.

The camera 80 takes an image of the ion beam 2 in the XZ plane in a region from the analysis slit 40 to the upstream side of the analysis slit 40, and outputs the image data $D_1$. In this example, the analysis slit 40 is configured by two plates which are separated from each other in the X direction across the opening 42. Since the opening 42 extends from the upper side of the analysis slit 40 to the lower side of the analysis slit 40 in the Y direction, the opening 42 can be seen from the upper side or the lower side of the analysis slit 40 in the Y direction.

The camera 80 is disposed above or below the analysis slit 40 in the Y direction, and a view field 82 of the camera 80 covers a region from the opening 42 of the analysis slit 40 to a place which is somewhat upstream from the analysis slit 40. The camera 80 is not required to be introduced into the path of the ion beam 2 to receive the ion beam 2, and hence may be fixed to the outside of the path of the ion beam 2.

As disclosed also in JP-A-2006-196400, the ion beam 2 collides with a residual gas existing in the path of the ion beam to emit light. More correctly, the ion beam 2 collides with the residual gas existing in the path of the ion beam, so that a beam plasma is produced around the ion beam 2, and the beam plasma emits light. An emission intensity of the beam plasma depends on a beam current density of the ion beam 2 and a pressure of the residual gas.

When the image data $D_1$ from the camera 80 are processed, therefore, a deviation angle θ of an actual beam orbit of the ion beam entering the analysis slit 40 (more specifically, the opening 42), from the design beam orbit 4 in the XZ plane can be obtained.

More specifically, in two places in the traveling direction Z of the ion beam 2, center positions $x_1$, $x_2$ in the X direction of the ion beam 2 can be measured. A distance $L_1$ between the center positions $x_1$, $x_2$ along the beam orbit 4 is previously known, and hence the deviation angle θ can be calculated by the following formula or a formula which is mathematically equivalent to the following formula. In the case where the center positions $x_1$, $x_2$ are to be obtained, the measurement may be performed at a peak position of light emission of the ion beam 2, or at the position of the center of gravity. Preferably, the measuring methods which are performed respectively in the two places are identical with each other.

$$\theta = \tan^{-1}\{(x_1 - x_2)/L_1\} \qquad \text{[Formula 3]}$$

In the example, the Z-direction position of the center position $x_1$ is set to the center of the thickness of the analysis slit 40. However, this configuration is not essential. For example, the position is set to the upstream surface of the analysis slit 40 or the further upstream side, or the downstream surface of the analysis slit 40 or the further downstream side. In essence, the position is required to be within the view field 82 of the camera 80. Also the Z-direction position of the center position $x_2$ is required to be within the view field 82 of the camera 80.

The first exemplary embodiment of the method of correcting a beam orbit which is performed by using the camera 80, the rear-stage beam measuring instrument 70, and the like will be described with reference to the flowchart of FIG. 6, and also to FIGS. 7 to 14. FIGS. 7 to 10 show an example of the case where the deviation angle θ is an angle which is inside the design beam orbit 4, and FIGS. 11 to 14 show an example of the case where the deviation angle θ is an angle which is outside the design beam orbit.

In the specification, referring to FIG. 1, with respect to the design beam orbit 4 of the ion beam 2 which extends from the ion source 10a to the analysis slit 40 through an arcuate orbit in the analysis electromagnet 30 in the XZ plane, a side toward the center 5 of the arc is referred to as an inner side, and the side opposite to the inner side is referred to as an outer side. Therefore, the first extraction electrode 22a is positioned in the inner side, and the second extraction electrode 22b is positioned in the outer side. In the case where the ion beam 2 emitted from the ion source 10a passes along the design beam orbit 4, the ion beam is referred to as the ion beam 2b, and, in the case where the ion beam passes inside the design beam orbit, the ion beam is referred to as the ion beam 2a, and, in the case where the ion beam passes outside the design beam orbit, the ion beam is referred to as the ion beam 2c.

First, the analysis electromagnet current $I_3$ is adjusted so that the beam current $I_2$ measured by the rear-stage beam measuring instrument 70 is maximum, thereby adjusting the intensity of the magnetic field B in the analysis electromagnet 30 (step 100). This step is an analysis electromagnet current adjusting step.

Figure 7:
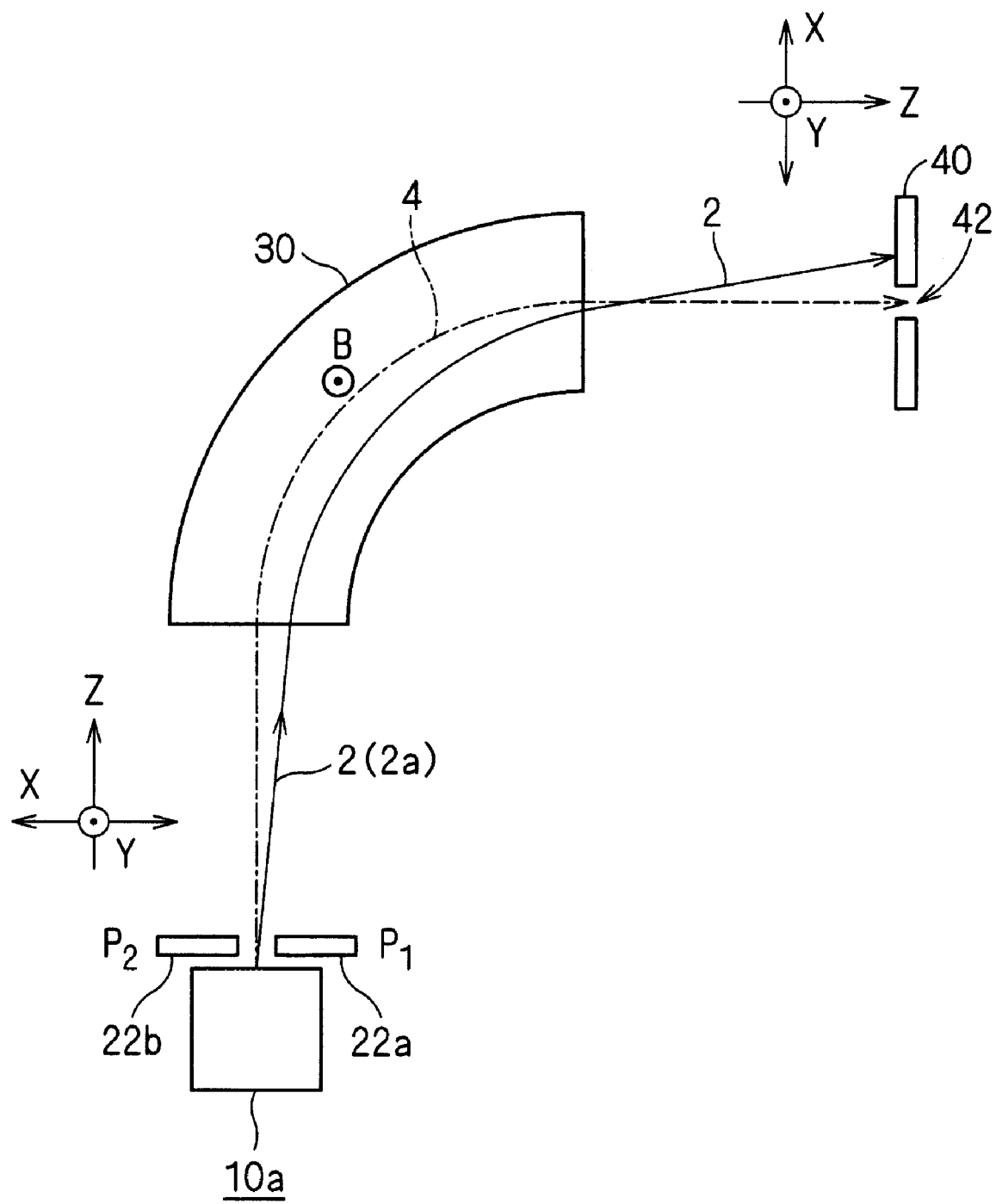
FIG. 7 is a schematic view showing an example of a step of the method of correcting a beam orbit in the case where the deviation angle is an angle in the inner side with respect to the design beam orbit.
Figure 8:
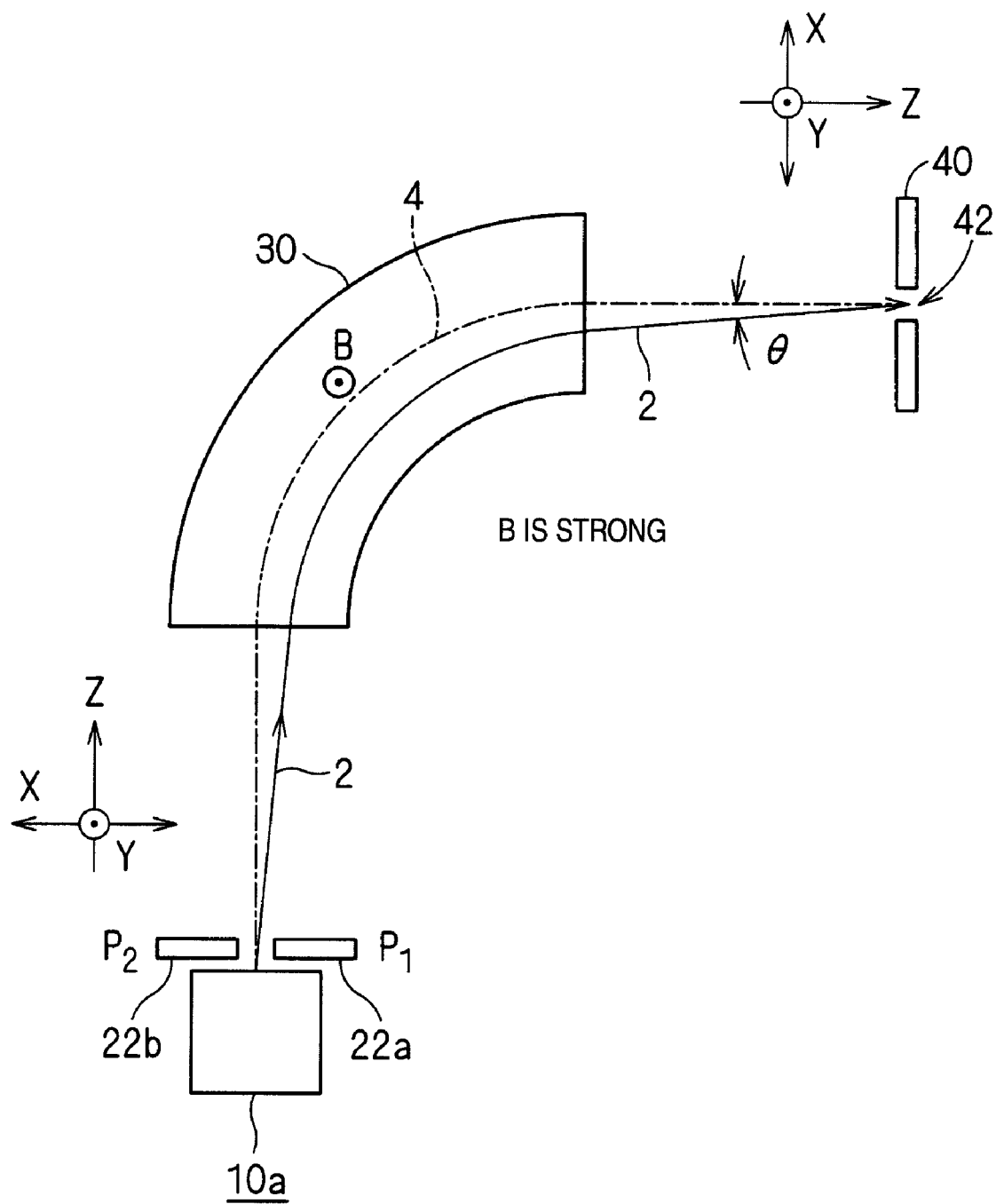
FIG. 8 is a schematic view showing an example of a step of the method of correcting the beam orbit in the case where the deviation angle is an angle in the inner side with respect to the design beam orbit.
Figure 12:
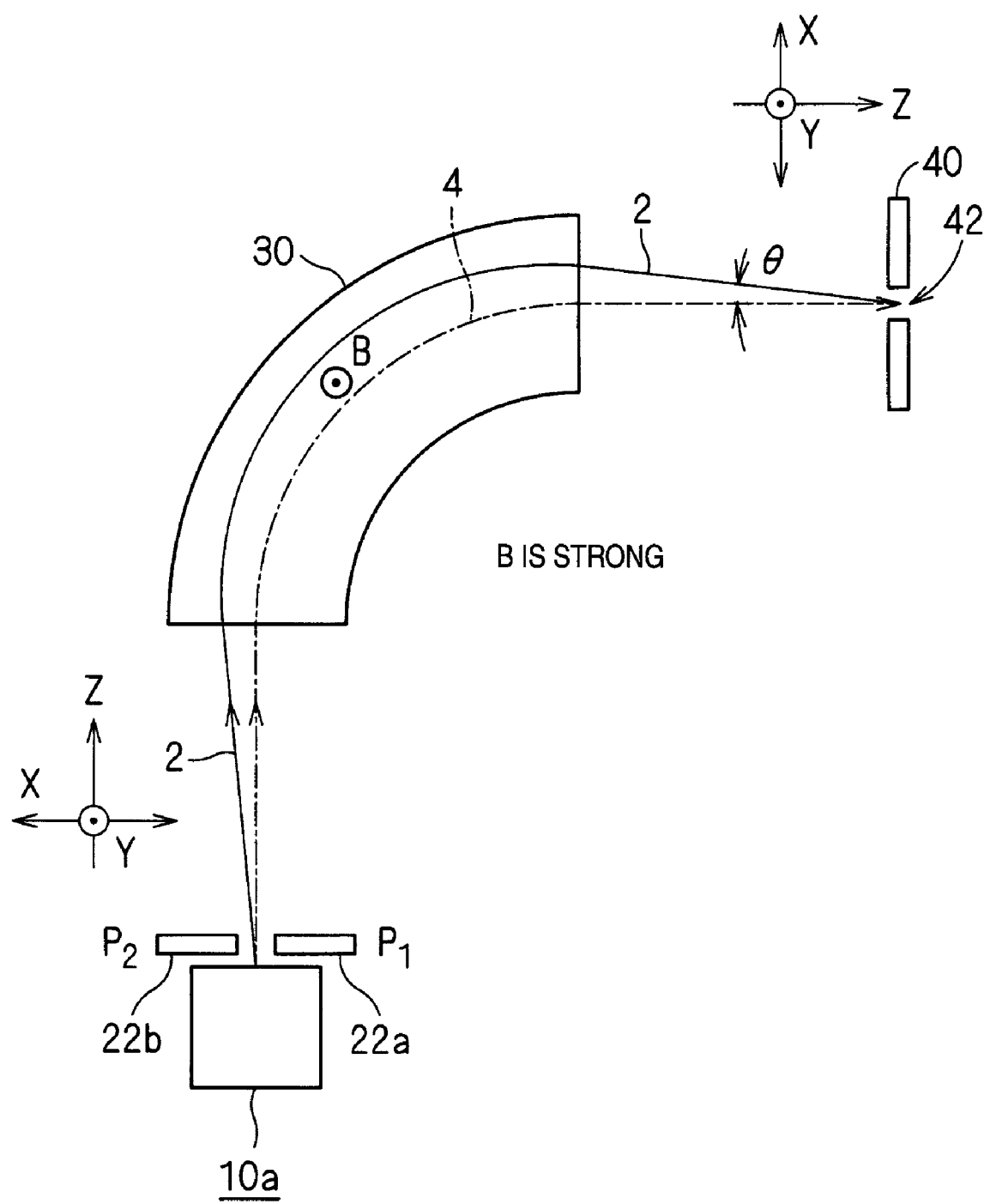
FIG. 12 is a schematic view showing an example of a step of the method of correcting the beam orbit in the case where the deviation angle is an angle in the outer side with respect to the design beam orbit.

In the case where the ion beam 2 emitted from the ion source 10a is shifted inward as indicated by the ion beam 2a shown in FIG. 7 and the ion beam 2 entering the analysis slit 40 is shifted outward, for example, the analysis electromagnet current $I_3$ is increased to intensify the magnetic field B, whereby the deflection of the ion beam 2 in the analysis electromagnet 30 is enhanced so that the ion beam 2 impinges on the center of the opening 42 of the analysis slit 40. FIG. 8 shows an example of this state. Also in the case where the ion beam 2 emitted from the ion source 10a is shifted outward as indicated by the ion beam 2c shown in FIG. 11 and the ion beam 2 entering the analysis slit 40 is shifted outward, the analysis electromagnet current $I_3$ is increased to intensify the magnetic field B, whereby the deflection of the ion beam 2 in the analysis electromagnet 30 is enhanced so that the ion beam 2 impinges on the center of the opening 42 of the analysis slit 40. FIG. 12 shows an example of this state.

Next, the camera 80 takes an image of the ion beam 2 (step 101), and the image data $D_1$ from the camera 80 are processed to calculate the deviation angle θ (step 102). The detail of the method has been described above. The formula of calculating the deviation angle θ has been indicated by Formula 3 above. This step is a deviation angle measuring step.

In the state shown in FIG. 8, for example, the deviation angle θ is an angle which is inside the design beam orbit 4, and, in the state shown in FIG. 12, the deviation angle θ is an angle which is outside the design beam orbit 4. In the first exemplary embodiment, in the case of an inside angle, the sign of the deviation angle θ is − (minus), and, in the case of an outside angle, the sign of the deviation angle θ is + (plus).

Next, it is determined whether the deviation angle θ measured in the deviation angle measuring step is within a threshold allowable range ϵ or not (step 103). If not within the allowable range, the process proceeds to step 104, and the potential difference ΔP between the first and second extraction electrodes 22a, 22b is adjusted by using the DC power supplies 52a, 52b so that, when the ion beam 2 leaves the extraction electrode system 20a, the ion beam 2 is bent by the potential difference ΔP, in a direction along which the deviation angle θ is reduced (step 104). This step is a potential difference adjusting step.

For example, the threshold allowable range ϵ is a range of about ±0.5 deg. to ±1.0 deg. However, the range ϵ is not restricted to this range.

Figure 9:
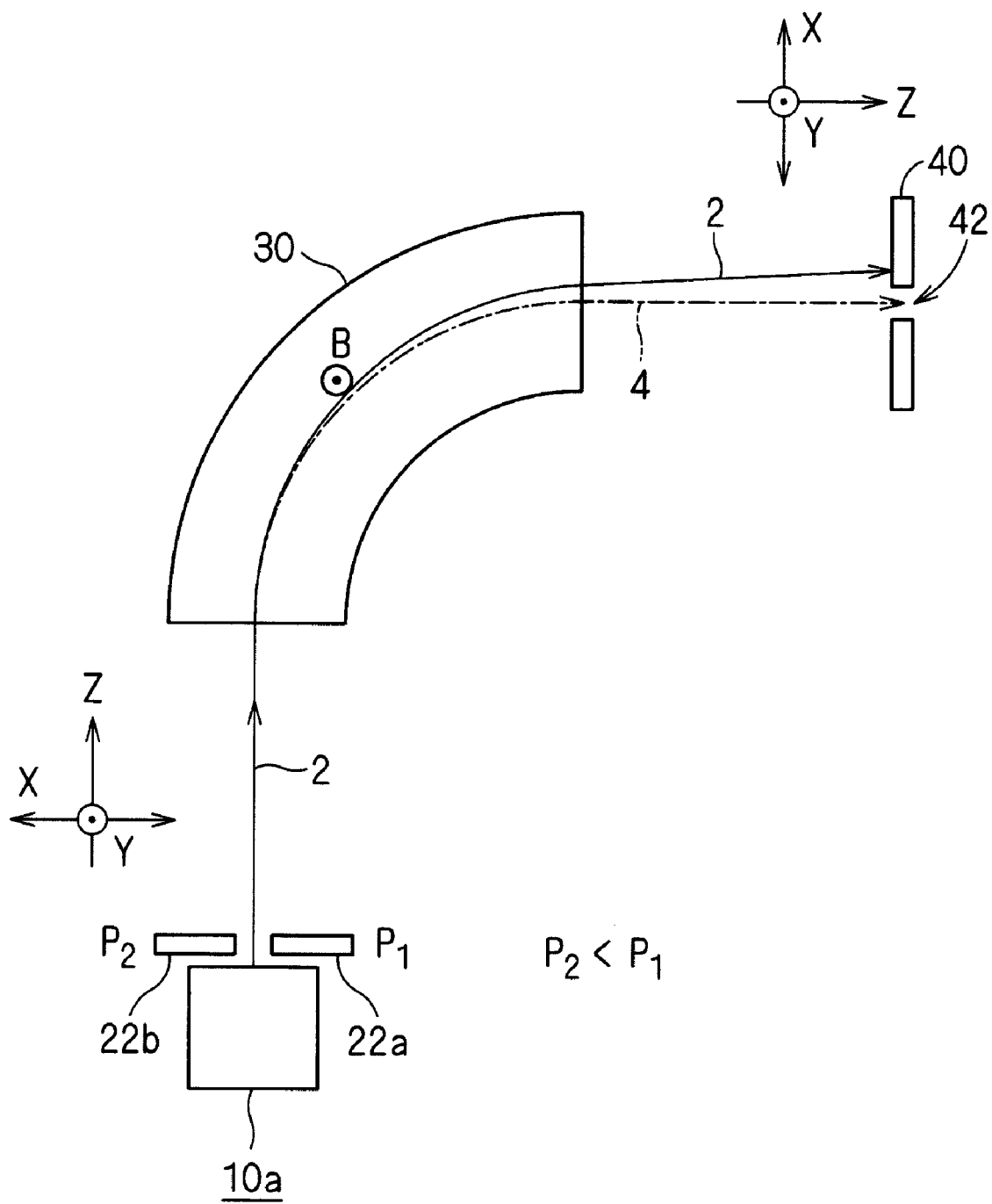
FIG. 9 is a schematic view showing an example of a step of the method of correcting the beam orbit in the case where the deviation angle is an angle in the inner side with respect to the design beam orbit.

In the case where, as shown in FIG. 8, the deviation angle θ is not within the allowable range ϵ (i.e., |θ|>|ϵ|, the same shall apply hereinafter) and is an inside angle, for example, the potential difference ΔP is adjusted so that the potential $P_1$ of the first extraction electrode 22a is higher than the potential $P_2$ of the second extraction electrode 22b (i.e., so that $P_2 < P_1$ is set). Specifically, as seen also from Formula 2 above, the difference between the output voltage $V_2$ of the second DC power supply 52b and the output voltage $V_1$ of the first DC power supply 52a is adjusted. As described above, therefore, the ion beam 2 emitted from the ion source 10a is deflected toward the outside, and hence the state such as shown in FIG. 9 is attained.

Figure 13:
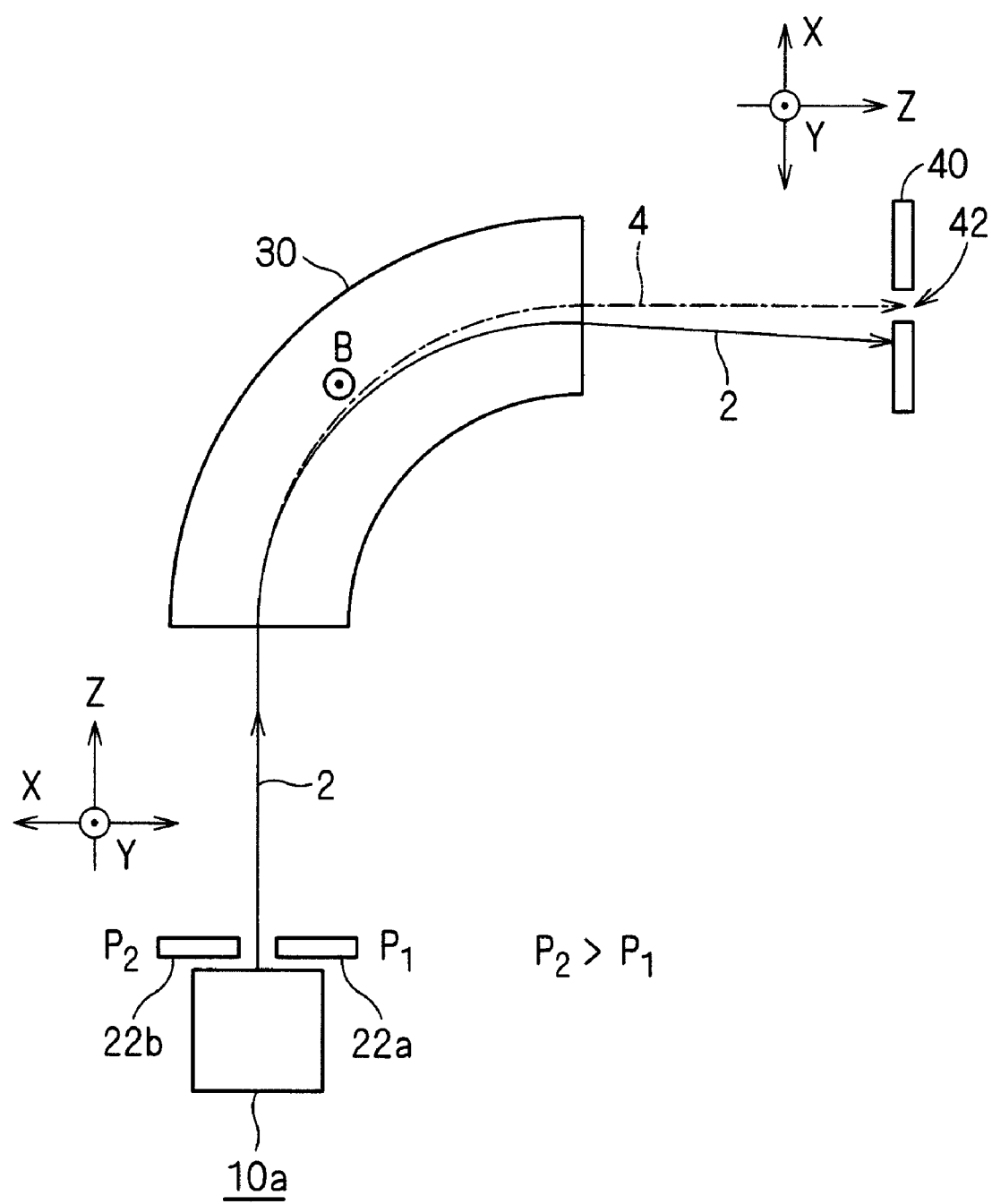
FIG. 13 is a schematic view showing an example of a step of the method of correcting the beam orbit in the case where the deviation angle is an angle in the outer side with respect to the design beam orbit.

As shown in FIG. 12, in the case where the deviation angle θ is not within the allowable range ϵ and is an outside angle, conversely, the potential difference ΔP is adjusted so that the potential $P_2$ of the second extraction electrode 22b is higher than the potential $P_1$ of the first extraction electrode 22a (i.e., so that $P_2 > P_1$ is set). Specifically, as seen also from Formula 2 above, the difference between the output voltage $V_2$ of the second DC power supply 52b and the output voltage $V_1$ of the first DC power supply 52a is adjusted. As described above, therefore, the ion beam 2 emitted from the ion source 10a is deflected toward the inside, and hence the state such as shown in FIG. 13 is attained.

Relationships between the direction of the deviation angle θ and the adjusted potentials $P_1$, $P_2$ are summarized in Table 1.

TABLE 1

| Deviation angle θ | Relationship of adjusted electrode potential |
|---|---|
| Inside design beam orbit | $P_2 < P_1$ |
| Outside design beam orbit | $P_2 > P_1$ |

The adjustment of the potential difference ΔP in the potential difference adjusting step may be performed so that (a) a potential difference $\Delta P_1$ [V/deg.] which is suitable for correcting the deviation angle θ by 1 deg. is previously obtained by a simulation or the like, and then the potential difference ΔP is adjusted by Formula 4 below, or (b) the potential difference is adjusted by a step of an adequate voltage, for example, 100 V. For example, the potential difference $\Delta P_1$ is 550 V/deg. In method (a), an adequate potential difference ΔP can be realized more rapidly.

$$\Delta P = \Delta P_1 \times \theta [V] \quad \text{[Formula 4]}$$

Then, the analysis electromagnet current adjusting step, the deviation angle measuring step, and the potential difference adjusting step are performed one or more times until the deviation angle θ measured by a deviation angle measuring instrument is within the allowable range ϵ.

Figure 10:
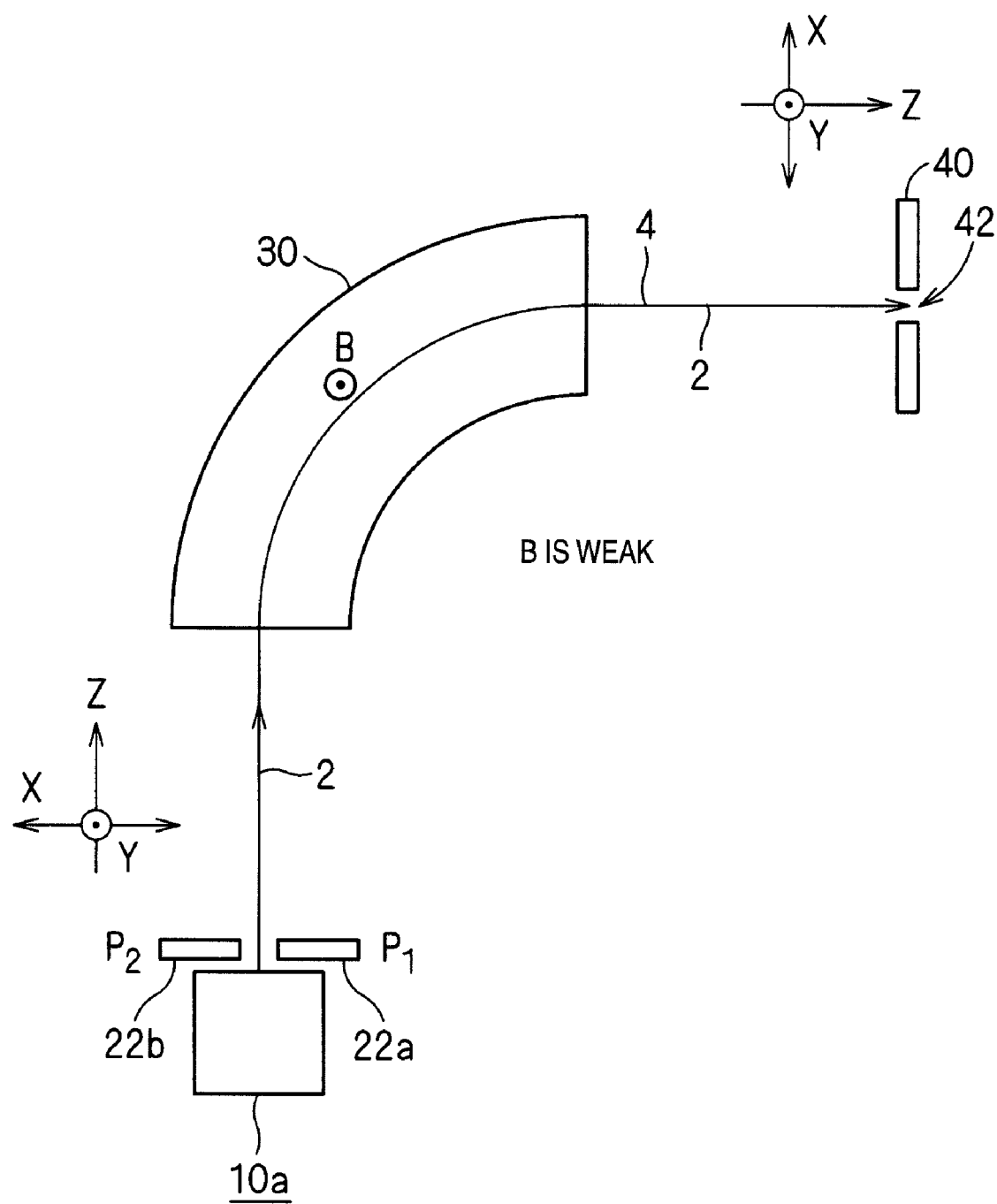
FIG. 10 is a schematic view showing an example of a step of the method of correcting the beam orbit in the case where the deviation angle is an angle in the inner side with respect to the design beam orbit.
Figure 11:
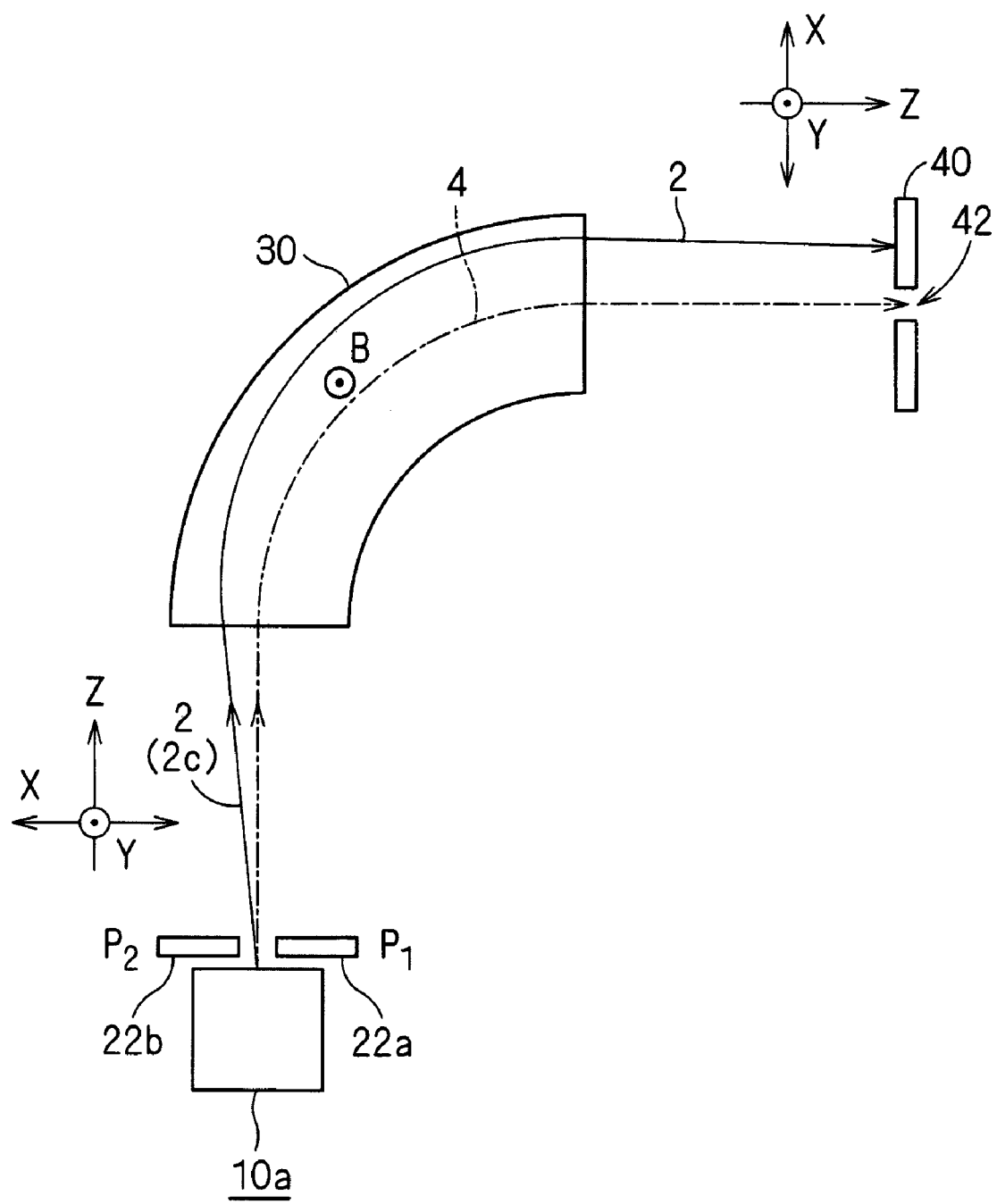
FIG. 11 is a schematic view showing an example of a step of the method of correcting the beam orbit in the case where the deviation angle is an angle in the outer side with respect to the design beam orbit.
Figure 14:
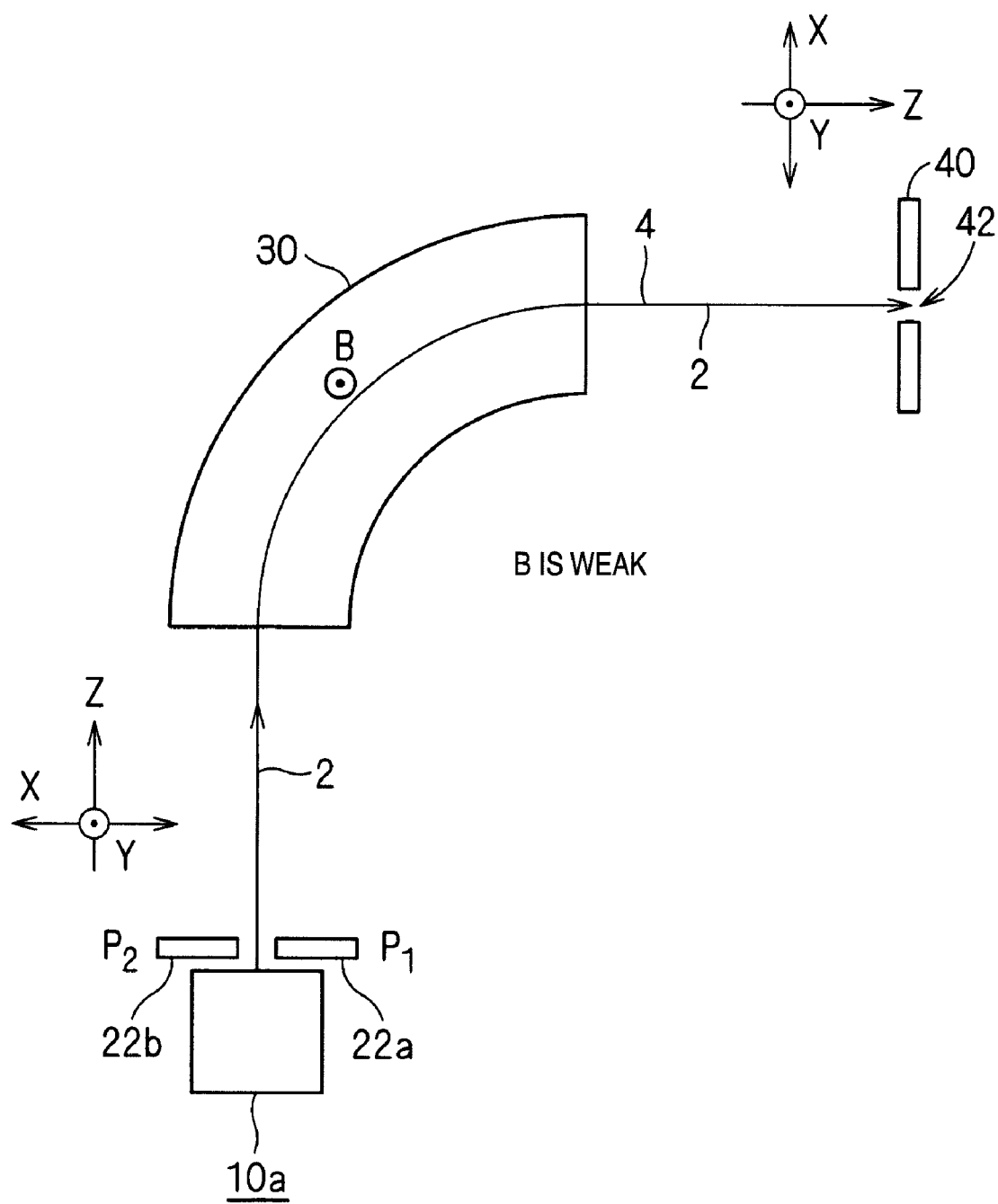
FIG. 14 is a schematic view showing an example of a step of the method of correcting the beam orbit in the case where the deviation angle is an angle in the outer side with respect to the design beam orbit.

In the examples shown in FIGS. 9 and 13, for example, the analysis electromagnet current $I_3$ is reduced to weaken the magnetic field B so that the beam current $I_2$ measured by the rear-stage beam measuring instrument 70 is maximum, thereby weakening the deflection of the ion beam 2 in the analysis electromagnet 30. As a result, the states shown in FIGS. 10 and 14 are respectively attained, and the deviation angle θ enters within the allowable range ϵ.

As described above, according to the method of correcting a beam orbit, even in the case where the direction of the ion source 10a is not variable, when the orbit of the ion beam 2 emitted from the ion source 10a is affected by the magnetic field 18 extending in the Y direction in the ion source 10a to be shifted from the design beam orbit 4, the orbit of the ion beam 2 entering the analysis slit 40 can be corrected, and the beam orbit can be made close to the design beam orbit 4.

As a result, the efficiency of transporting the ion beam 2 to the target 6 can be enhanced. Furthermore, it is possible to suppress the incident angle of the ion beam 2 incident on the target 6 from being deviated from a designed value.

Moreover, the extraction electrode 22 constituting the extraction electrode system 20a of the ion source 10a is dividedly configured by the first extraction electrode 22a and second extraction electrode 22b which are on both sides of the path of the ion beam 2 in the X direction, and the first and second extraction electrodes 22a and 22b are used for controlling the beam orbit. Therefore, it is not necessary to dispose an electrode for correcting the beam orbit in the beam line in addition to the extraction electrode system 20a. As a result, the beam line can be prevented from being lengthened. Also from this viewpoint, therefore, the efficiency of transporting the ion beam 2 can be enhanced.

As described above, the ion implanting apparatus shown in FIG. 1 includes the controlling device 90. The beam current $I_2$ measured by the rear-stage beam measuring instrument 70, the image data $D_1$ from the camera 80, and various setting information are given to the controlling device 90. In the setting information, for example, the allowable range ϵ, the position of the design beam orbit 4, and the distance $L_1$ (see FIG. 5) are included. The controlling device 90 has a function of, on the basis of the given information, controlling the first DC power supply 52a, the second DC power supply 52b, and the analysis electromagnet power supply 32.

More specifically, in the first exemplary embodiment, the controlling device 90 has a function of performing a control the contents of which are substantially identical with those of the analysis electromagnet current adjusting step, deviation angle measuring step, and potential difference adjusting step that have been described with reference to the flowchart of FIG. 6.

Namely, the controlling device 90 has a function of, until the deviation angle θ measured by a deviation angle measuring control that will be described later is within the allowable range ϵ, performing one or more times: (a) an analysis electromagnet current adjusting control where the analysis electromagnet power supply 32 is controlled so that the beam current $I_2$ measured by the rear-stage beam measuring instrument 70 is maximum, thereby adjusting the analysis electromagnet current $I_3$; (b) the deviation angle measuring control where the image data $D_1$ from the camera 80 are processed to obtain the deviation angle θ of the actual beam orbit of the ion beam 2 entering the analysis slit 40, from the design beam orbit 4 in the XZ plane; and (c) a potential difference adjusting control where it is determined whether the deviation angle θ measured in the deviation angle measuring control is within the threshold allowable range ϵ or not, and, if not within the allowable range ϵ, the DC power supplies 52a, 52b are controlled to adjust the potential difference ΔP so that, when the ion beam leaves the extraction electrode system 20a, the ion beam 2 is bent by the potential difference ΔP between the first extraction electrode 22a and the second extraction electrode 22b, in a direction along which the deviation angle θ is reduced.

In the first exemplary embodiment, the controlling device 90 adjusts the potential difference ΔP in the potential difference adjusting control so that, in the case where the deviation angle θ is an angle which is outside the design beam orbit 4, the potential $P_2$ of the second extraction electrode 22b is higher than the potential $P_1$ of the first extraction electrode 22a, and, in the case where the deviation angle θ is an angle which is inside the design beam orbit 4, the potential $P_1$ of the first extraction electrode 22a is higher than the potential $P_2$ of the second extraction electrode 22b. The controlling device 90 shown in FIG. 15 more specifically performs a control which is similar to that described above.

Therefore, the measurement and adjustment the contents of which are substantially identical with those of the analysis electromagnet current adjusting step, deviation angle measuring step, and potential difference adjusting step can be performed by using the controlling device 90, so that a labor can be saved.

Next, a second exemplary embodiment of the method of correcting a beam orbit and the ion implanting apparatus will be described with reference to FIGS. 15 to 17. Portions which are identical or corresponding to those of the first exemplary embodiment shown in FIGS. 1 to 14 are denoted by the same reference numerals, and, in the following description, emphasis is placed on differences from the first exemplary embodiment.

Figure 15:
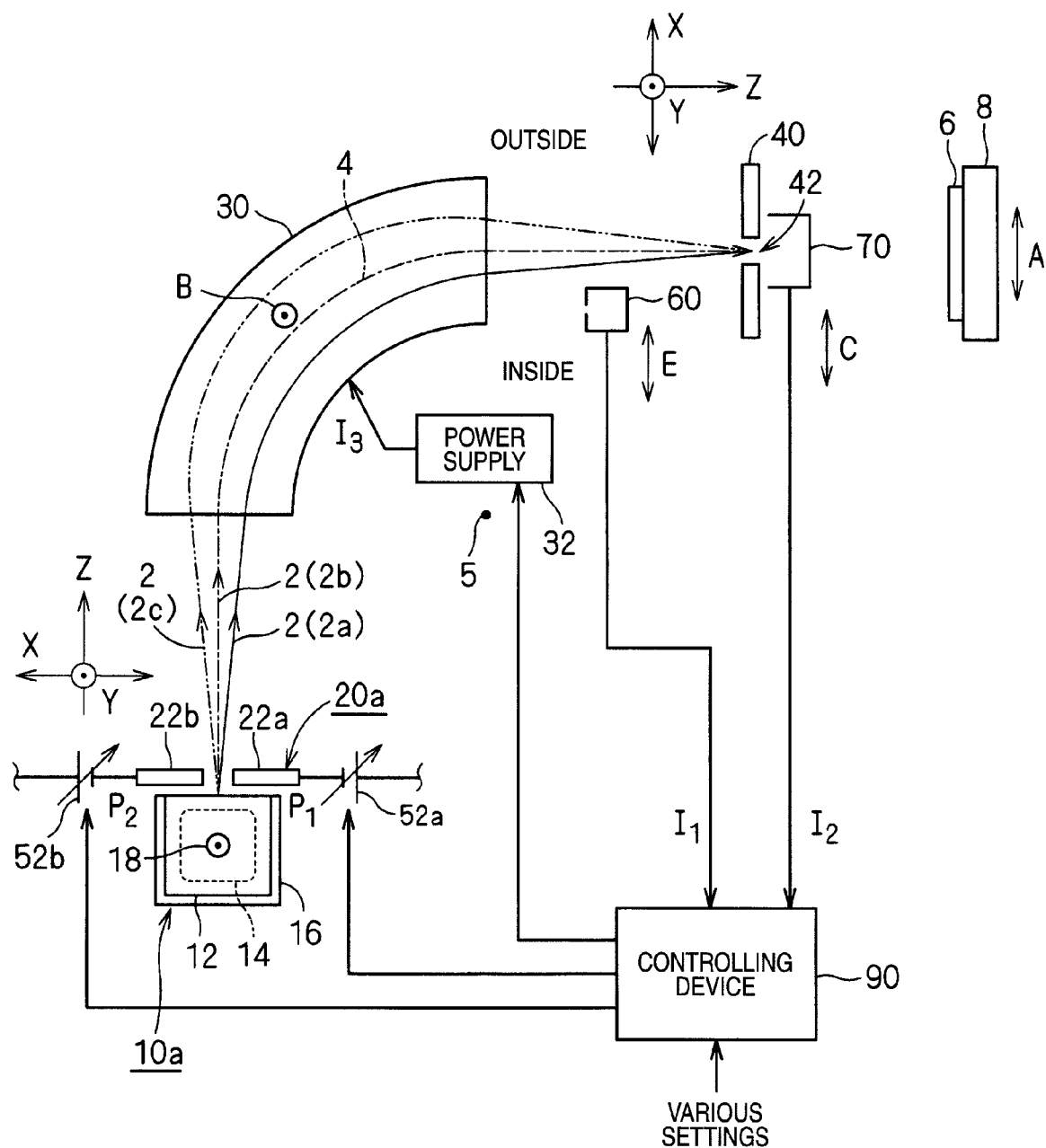
FIG. 15 is a schematic plan view showing a second exemplary embodiment of the ion implanting apparatus for performing a method of correcting a beam orbit of the invention.
Figure 16:
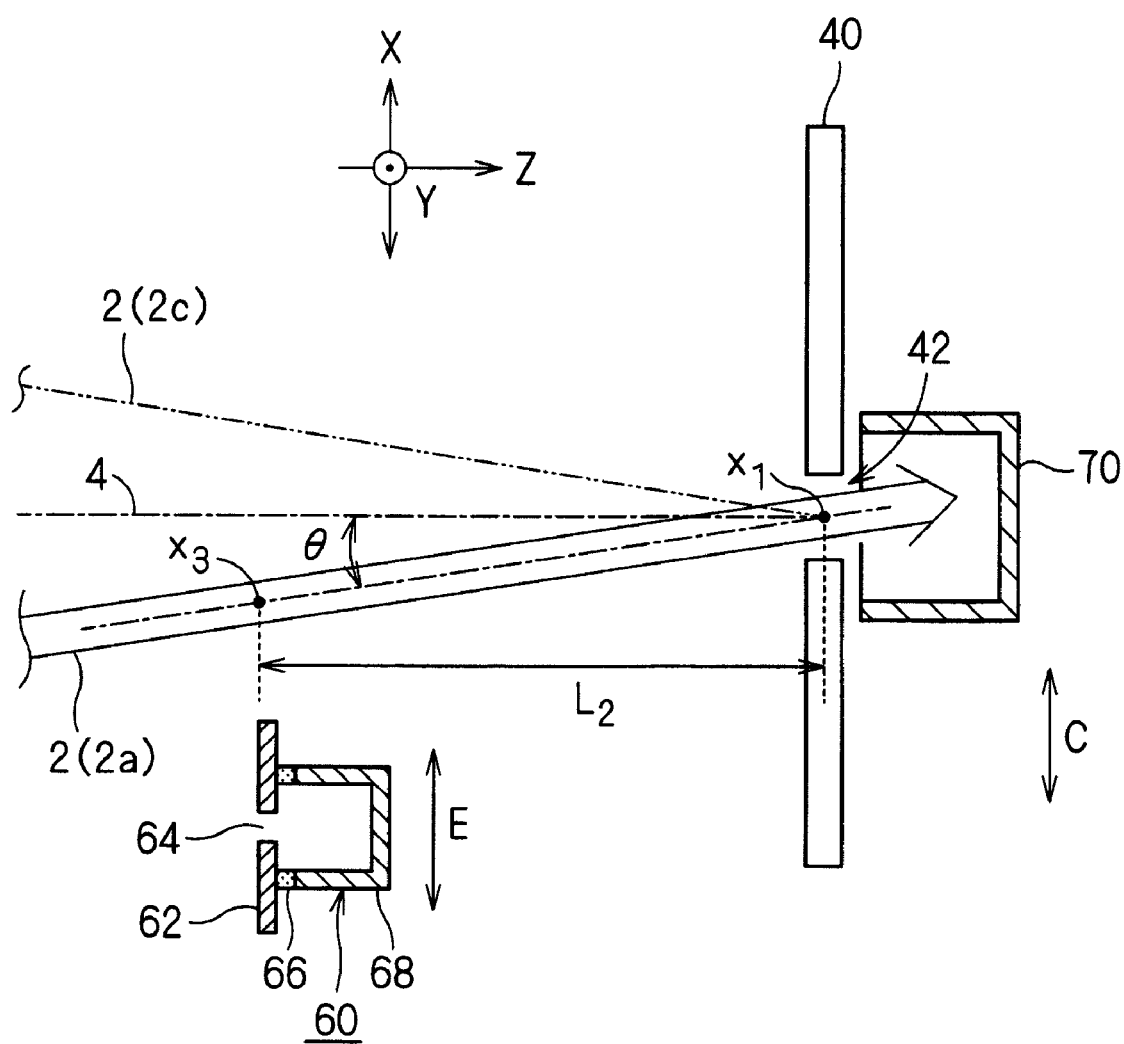
FIG. 16 is a plan view showing a detailed example of a vicinity of an analysis slit in FIG. 15.

As shown in FIGS. 15 and 16, in place of the camera 80, the ion implanting apparatus of the second exemplary embodiment includes a front-stage beam measuring instrument 60 which receives the ion beam 2 between the analysis electromagnet 30 and the analysis slit 40, to measure the beam current density distribution in the X direction.

In the second exemplary embodiment, as shown in FIG. 16, the front-stage beam measuring instrument 60 includes a mask 62 having an opening 64 the width of which is sufficiently smaller than that of the ion beam 2 in the X direction, and a Faraday cup 68 which is placed in the vicinity of the downstream side of the mask 62 through an insulator 66. Lengths in the Y direction of the opening 64 and the Faraday cup 68 may have a value which allows the beam current density $I_1$ of the ion beam 2 to be measured, and are not restricted to a specific value. The front-stage beam measuring instrument 60 can receive the ion beam 2 to measure the beam current density $I_1$.

Moreover, in the second exemplary embodiment, as indicated by an arrow E, the front-stage beam measuring instrument 60 can be moved one-dimensionally in the X direction by a driving mechanism which is not shown, to cross the path of the ion beam 2. The beam current density distribution of the ion beam 2 in the X direction is measured by using the movable front-stage beam measuring instrument 60. From a peak position of the distribution, for example, it is possible to measure a center position $x_3$ of the ion beam 2 in the X direction.

In the analysis slit 40, the center position $x_1$ of the opening 42 in the X direction is previously known. Also, a distance $L_2$ between the front-stage beam measuring instrument 60 and the analysis slit 40 is previously known. In the example of FIG. 6, more specifically, the distance between the front face of the mask 62 and the center of the thickness of the analysis slit 40 is set as the distance $L_2$. The distance $L_2$ is not restricted to this distance. In essence, the distance $L_2$ is required to be a distance between positions where the above-described two center positions $x_1$, $x_3$ are defined, in a direction along the beam orbit 4. In accordance with the following formula or a formula which is mathematically equivalent to the following formula, the deviation angle θ can be calculated.

$$\theta=\tan^{-1}\{(x_1-x_3)/L_2\}$$ [Formula 5]

Figure 17:
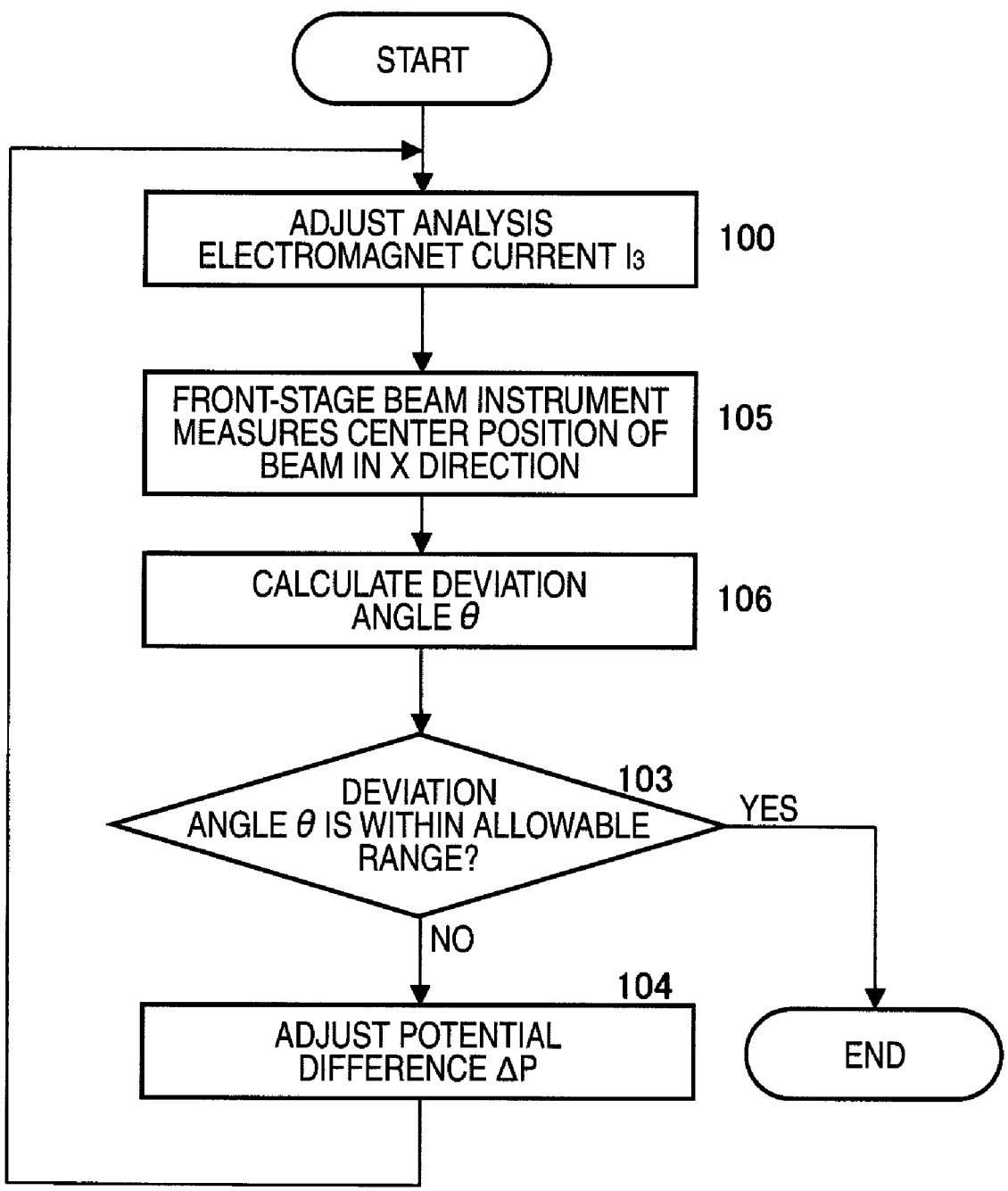
FIG. 17 is a flowchart showing the second exemplary embodiment of the method of correcting the beam orbit of the invention.

The second exemplary embodiment of the method of correcting a beam orbit which is performed by using the front-stage beam measuring instrument 60, the rear-stage beam measuring instrument 70, and the like is shown in the flowchart of FIG. 17. FIGS. 7 to 14 which have been described above can be applied as they are to the second exemplary embodiment.

The flowchart of FIG. 17 is different in steps 105 and 106 from that of FIG. 6, and hence the steps 105 and 106 will be described.

Figure 6:
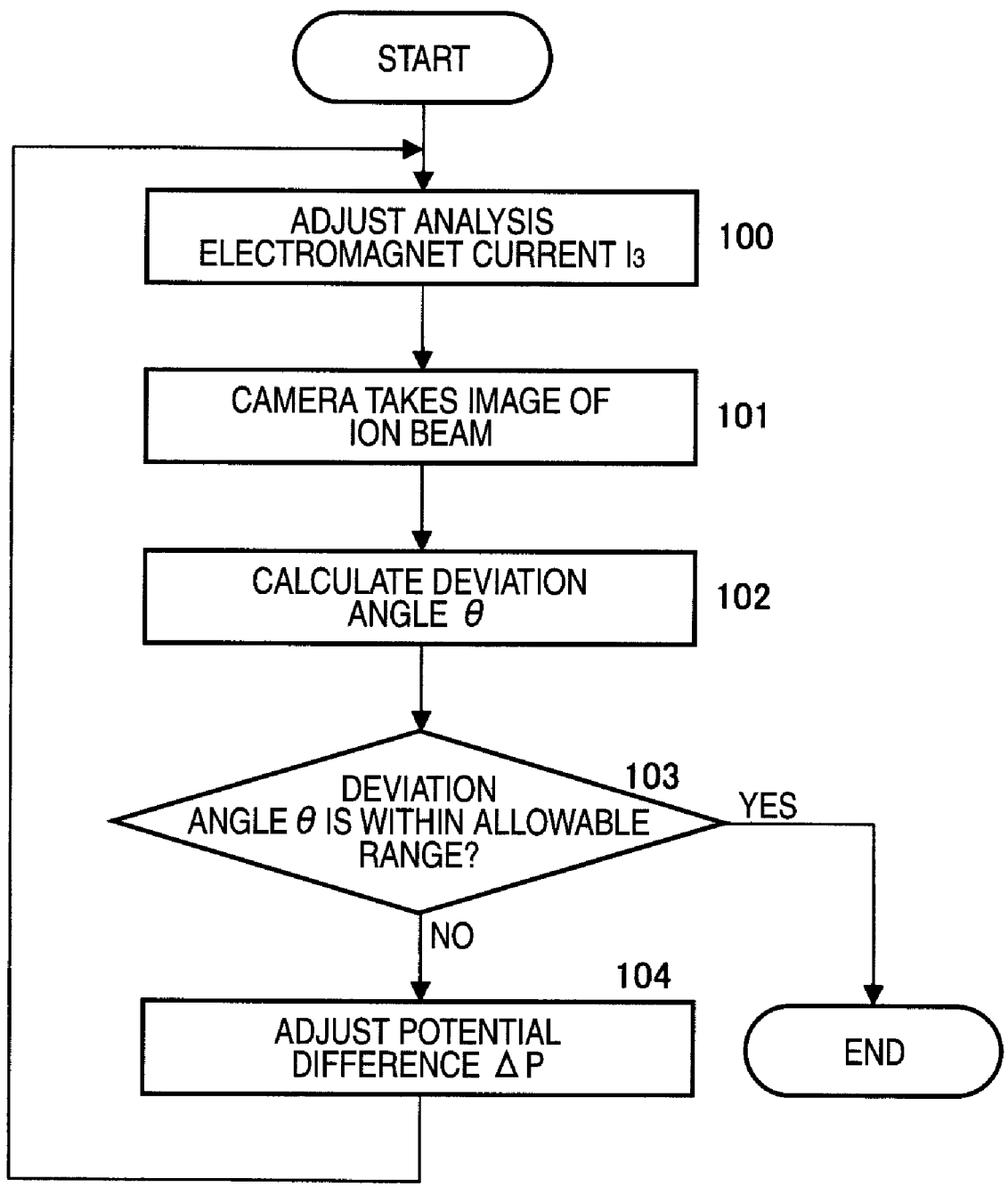
FIG. 6 is a flowchart showing the first exemplary embodiment of the method of correcting the beam orbit of the invention.

After the analysis electromagnet current adjusting step (step 100) the contents of which are identical with those of the flowchart of FIG. 6, the center position $x_3$ of the ion beam 2 in the X direction is measured by the front-stage beam measuring instrument 60 (step 105), and the deviation angle θ is calculated in accordance with Formula 5 above (step 106). These steps are performed as described above. This step is a deviation angle measuring step.

The contents of the potential difference adjusting step of steps 103 and 104 are identical with those of the flowchart of FIG. 6. In the same manner as the flowchart of FIG. 6, furthermore, the analysis electromagnet current adjusting step, the deviation angle measuring step, and the potential difference adjusting step are performed one or more times until the deviation angle θ measured in the deviation angle measuring step is within the allowable range ϵ.

Also in the method of correcting a beam of the second exemplary embodiment, therefore, effects similar to those of the method of correcting a beam of the first exemplary embodiment can be achieved. Namely, even in the case where the direction of the ion source 10a is not variable, when the orbit of the ion beam 2 emitted from the ion source 10a is affected by the magnetic field 18 extending in the Y direction in the ion source 10a to be shifted from the design beam orbit 4, the orbit of the ion beam 2 entering the analysis slit 40 can be corrected, and the beam orbit can be made close to the design beam orbit 4.

As a result, the efficiency of transporting the ion beam 2 to the target 6 can be enhanced. Furthermore, it is possible to suppress the incident angle of the ion beam 2 incident on the target 6 from being deviated from a designed value.

Moreover, the extraction electrode 22 constituting the extraction electrode system 20a of the ion source 10a is dividedly configured by the first extraction electrode 22a and second extraction electrode 22b which are on both sides of the path of the ion beam 2 in the X direction, and the first and second extraction electrodes 22a and 22b are used for controlling the beam orbit. Therefore, it is not necessary to dispose an electrode for correcting the beam orbit in the beam line in addition to the extraction electrode system 20a. As a result, the beam line can be prevented from being lengthened. Also from this viewpoint, therefore, the efficiency of transporting the ion beam 2 can be enhanced.

In place of the above-described front-stage beam measuring instrument 60 which is movable in the X direction, a multi-point front-stage beam instrument having a plurality of measuring points which are arranged in the X direction may be disposed, so that the front-stage beam instrument receives the ion beam 2 to measure the beam current density distribution in the X direction, and, from a peak position of the distribution, for example, the center position $X_3$ of the ion beam 2 in the X direction is measured. When the measurement is to be performed, also the multi-point front-stage beam instrument is introduced into the path of the ion beam 2, and, when the ion implantation is to be performed on the target 6, removed from the path of the ion beam 2.

The second exemplary embodiment in which the front-stage beam measuring instrument 60 which is movable in the X direction or the multi-point front-stage beam instrument is used is compared with the first exemplary embodiment in which the camera 80 is used. In the case where the camera 80 is used, the camera 80 can be fixed, and, in the measurement, it is not required to move the camera 80 into and from the beam path. Therefore, a moving mechanism is not necessary. As compared with the case where either of the above-described front-stage beam instruments, consequently, the configuration is simplified. Furthermore, the camera 80 is not required to receive the ion beam 2 (i.e., the ion beam 2 is not necessary to be incident on the camera 80). Unlike the case where the front-stage beam instrument which receives the ion beam 2 is used, therefore, there is no possibility of producing particles (contaminants) which may cause contamination of a surface of the target 6.

The beam current $I_2$ measured by the rear-stage beam measuring instrument 70, the beam current density $I_1$ measured by the front-stage beam measuring instrument 60, and various setting information are given to the controlling device 90 constituting the ion implanting apparatus shown in FIG. 15. In the setting information, for example, the allowable range $\epsilon$, the position of the design beam orbit 4, the center $x_1$, and the distance $L_2$ (see FIG. 16) are included. The controlling device 90 has a function of, on the basis of the given information, controlling the first DC power supply 52a, the second DC power supply 52b, and the analysis electromagnet power supply 32.

More specifically, in the second exemplary embodiment, the controlling device 90 has a function of performing a control the contents of which are substantially identical with those of the analysis electromagnet current adjusting step, deviation angle measuring step, and potential difference adjusting step that have been described with reference to the flowchart of FIG. 17.

Namely, the controlling device 90 has a function of, until the deviation angle $\theta$ measured by a deviation angle measuring control that will be described later is within the allowable range $\epsilon$, performing one or more times: (a) an analysis electromagnet current adjusting control where the analysis electromagnet power supply 32 is controlled so that the beam current $I_2$ measured by the rear-stage beam measuring instrument 70 is maximum, thereby adjusting the analysis electromagnet current $I_3$; (b) the deviation angle measuring control where the center position $X_3$ of the ion beam in the X direction is obtained by using measurement information (for example, the beam current density $I_1$) supplied from the front-stage beam measuring instrument 60 (or the multi-point front-stage beam instrument), and, by using the center position $x_3$ and the distance $L_2$ between the front-stage beam instrument and the analysis slit, the deviation angle $\theta$ of the actual beam orbit of the ion beam 2 entering the analysis slit 40 from the design beam orbit 4 in the XZ plane is obtained; and (c) a potential difference adjusting control where it is determined whether the deviation angle $\theta$ measured in the deviation angle measuring control is within the threshold allowable range $\epsilon$ or not, and, if not within the allowable range $\epsilon$, the DC power supplies 52a, 52b are controlled to adjust the potential difference $\Delta P$ so that, when the ion beam leaves the extraction electrode system 20a, the ion beam 2 is bent by the potential difference $\Delta P$ between the first extraction electrode 22a and the second extraction electrode 22b, in a direction along which the deviation angle $\theta$ is reduced.

Therefore, the measurement and adjustment the contents of which are substantially identical with those of the analysis electromagnet current adjusting step, deviation angle measuring step, and potential difference adjusting step that have been described above can be performed by using the controlling device 90, so that the labor can be saved.

While the present inventive concept has been shown and described with reference to certain exemplary embodiments thereof, it will be understood by those skilled in the art that various changes in form and details may be made therein without departing from the spirit and scope of the invention as defined by the appended claims.

What is claimed is:

1. A method of correcting a beam orbit wherein, an ion implanting apparatus including:
   an ion source from which, in a case where a design traveling direction of an ion beam is set as a Z direction, and two directions that are substantially perpendicular to each other in a plane that is substantially perpendicular to the Z direction are set as X and Y directions, respectively, a ribbon-like ion beam in which a dimension in the Y direction is larger than a dimension in the X direction is extracted, said ion source including:
   a plasma generating chamber in which a plasma is generated;
   an extraction electrode system which extracts an ion beam from the plasma in said plasma generating chamber by a function of an electric field, which has a plurality of electrodes in an ion beam extraction direction, and which some of said electrodes are set to a negative potential having an absolute value of 10 kV or higher with respect to a potential of said plasma generating chamber, an extraction electrode which is closest to the plasma is dividedly configured by first and second extraction electrodes which are on both sides of a path of the ion beam in the X direction; and
   a magnet which applies a magnetic field that extends along the Y direction into said plasma generating chamber;
   said ion implanting apparatus further including:
   an analysis electromagnet which, in an XZ plane, bends the ion beam extracted from said ion source by a magnetic field to perform a momentum analysis;
   a DC analysis electromagnet power supply which supplies to said analysis electromagnet an analysis electromagnet current that energizes said analysis electromagnet;
   an analysis slit which is disposed downstream of said analysis electromagnet to cooperate with said analysis electromagnet to perform a momentum analysis of the ion beam;
   a voltage-variable DC power supply which can form a potential difference between said first and second extraction electrodes;
   a front-stage beam instrument which receives the ion beam between said analysis electromagnet and said analysis slit, to measure a beam current density distribution in the X direction; and
   a rear-stage beam instrument which receives the ion beam that has passed through said analysis slit, to measure a current of the ion beam,
   wherein the ion beam which has passed through said analysis slit is caused to be incident on a target, said method comprising:
an analysis electromagnet current adjusting step of adjusting the analysis electromagnet current so that the beam current measured by said rear-stage beam instrument is maximum;
a deviation angle measuring step of measuring a center position of the ion beam in the X direction by using said front-stage beam instrument, and, by using the center position and a distance between said front-stage beam instrument and said analysis slit, obtaining a deviation angle of an actual beam orbit of the ion beam entering said analysis slit, from a design beam orbit in the XZ plane; and
a potential difference adjusting step of determining whether the deviation angle measured in said deviation angle measuring step is within a threshold allowable range or not, and, if not within the allowable range, adjusting the potential difference by using said DC power supply so that, when the ion beam leaves said extraction electrode system, the ion beam is bent by the potential difference between said first and second extraction electrodes, in a direction along which the deviation angle is reduced,
wherein said method performs one or more times until the deviation angle measured in said deviation angle measuring step is within the threshold allowable range.

2. A method of correcting a beam orbit according to claim 1, wherein, when, with respect to the design beam orbit which extends in the XZ plane from said ion source to said analysis slit through an arcuate orbit in said analysis electromagnet, a side toward a center of the arc is referred to as an inner side, and a side opposite to the inner side is referred to as an outer side, said first extraction electrode is located in the inner side, and said second extraction electrode is located in the outer sidem, when the deviation angle is an angle in the outer side with respect to the design beam orbit, the potential difference is adjusted in said potential difference adjusting step so that a potential of said second extraction electrode is higher than a potential of said first extraction electrode, and, when the deviation angle is an angle in the inner side with respect to the design beam orbit, the potential difference is adjusted in said potential difference adjusting step so that the potential of said first extraction electrode is higher than the potential of said second extraction electrode.

3. A method of correcting a beam orbit wherein, an ion implanting apparatus including:
an ion source from which, in a case where a design traveling direction of an ion beam is set as a Z direction, and two directions that are substantially perpendicular to each other in a plane that is substantially perpendicular to the Z direction are set as X and Y directions, respectively, a ribbon-like ion beam in which a dimension in the Y direction is larger than a dimension in the X direction is extracted, said ion source including:
a plasma generating chamber in which a plasma is generated;
an extraction electrode system which extracts an ion beam from the plasma in said plasma generating chamber by a function of an electric field, which has a plurality of electrodes in an ion beam extraction direction, and which some of said electrodes are set to a negative potential having an absolute value of 10 kV or higher with respect to a potential of said plasma generating chamber, an extraction electrode which is closest to the plasma is dividedly configured by first and second extraction electrodes which are on both sides of a path of the ion beam in the X direction; and
a magnet which applies a magnetic field that extends along the Y direction into said plasma generating chamber;
said ion implanting apparatus further including:
an analysis electromagnet which, in an XZ plane, bends the ion beam extracted from said ion source by a magnetic field to perform a momentum analysis;
a DC analysis electromagnet power supply which supplies to said analysis electromagnet an analysis electromagnet current that energizes said analysis electromagnet;
an analysis slit which is disposed downstream of said analysis electromagnet to cooperate with said analysis electromagnet to perform a momentum analysis of the ion beam;
a voltage-variable DC power supply which can form a potential difference between said first and second extraction electrodes a camera which takes an image of the ion beam in the XZ plane in a region from said analysis slit to an upstream side of said analysis slit, and which outputs data of the image, and
a rear-stage beam instrument which receives the ion beam that has passed through said analysis slit, to measure a current of the ion beam, said method comprising:
an analysis electromagnet current adjusting step of adjusting the analysis electromagnet current so that the beam current measured by said rear-stage beam instrument is maximum;
a deviation angle measuring step of processing the image data from said camera to obtain a deviation angle of an actual beam orbit of the ion beam entering said analysis slit, from a design beam orbit in the XZ plane;
a potential difference adjusting step of determining whether the deviation angle measured in said deviation angle measuring step is within a threshold allowable range or not, and, if not within the allowable range, adjusting the potential difference by using said DC power supply so that, when the ion beam leaves said extraction electrode system, the ion beam is bent by the potential difference between said first and second extraction electrodes, in a direction along which the deviation angle is reduced,
wherein said method performs one or more times until the deviation angle measured in said deviation angle measuring step is within the threshold allowable range.

4. A method of correcting a beam orbit according to claim 3, wherein, when, with respect to the design beam orbit which extends in the XZ plane from said ion source to said analysis slit through an arcuate orbit in said analysis electromagnet, a side toward a center of the arc is referred to as an inner side, and a side opposite to the inner side is referred to as an outer side, said first extraction electrode is located in the inner side, and said second extraction electrode is located in the outer sidem, when the deviation angle is an angle in the outer side with respect to the design beam orbit, the potential difference is adjusted in said potential difference adjusting step so that a potential of said second extraction electrode is higher than a potential of said first extraction electrode, and, when the deviation angle is an angle in the inner side with respect to the design beam orbit, the potential difference is adjusted in said potential difference adjusting step so that the potential of said first extraction electrode is higher than the potential of said second extraction electrode.

5. An ion implanting apparatus comprising:
an ion source from which, in a case where a design traveling direction of an ion beam is set as a Z direction, and two directions that are substantially perpendicular to each other in a plane that is substantially perpendicular to the Z direction are set as X and Y directions, respectively, a ribbon-like ion beam in which a dimension in the Y direction is larger than a dimension in the X direction is extracted, said ion source including:
a plasma generating chamber in which a plasma is generated;
an extraction electrode system which extracts an ion beam from the plasma in said plasma generating chamber by a function of an electric field, which has a plurality of electrodes in an ion beam extraction direction, and which some of said electrodes are set to a negative potential having an absolute value of 10 kV or higher with respect to a potential of said plasma generating chamber, an extraction electrode which is closest to the plasma is dividedly configured by first and second extraction electrodes which are on both sides of a path of the ion beam in the X direction; and
a magnet which applies a magnetic field that extends along the Y direction into said plasma generating chamber;
said ion implanting apparatus further comprising:
an analysis electromagnet which, in an XZ plane, bends the ion beam extracted from said ion source by a magnetic field to perform a momentum analysis;
a DC analysis electromagnet power supply which supplies to said analysis electromagnet an analysis electromagnet current that energizes said analysis electromagnet;
an analysis slit which is disposed downstream of said analysis electromagnet to cooperate with said analysis electromagnet to perform a momentum analysis of the ion beam;
a voltage-variable DC power supply which can form a potential difference between said first and second extraction electrodes;
a front-stage beam instrument which receives the ion beam between said analysis electromagnet and said analysis slit, to measure a beam current density distribution in the X direction;
a rear-stage beam instrument which receives the ion beam that has passed through said analysis slit, to measure a current of the ion beam; and
a controlling device which performs one or more times: (a) an analysis electromagnet current adjusting control where said analysis electromagnet power supply is controlled to adjust the analysis electromagnet current so that the beam current measured by said rear-stage beam instrument is maximum; (b) a deviation angle measuring control where a center position of the ion beam in the X direction is obtained by using measurement information supplied from said front-stage beam instrument, and, by using the center position and a distance between said front-stage beam instrument and said analysis slit, a deviation angle of an actual beam orbit of the ion beam entering said analysis slit from a design beam orbit in the XZ plane is obtained; and (c) a potential difference adjusting control where it is determined whether the deviation angle measured in said deviation angle measuring control is within a threshold allowable range or not, and, if not within the allowable range, said DC power supply is controlled to adjust the potential difference so that, when the ion beam leaves said extraction electrode system, the ion beam is bent by the potential difference between said first and second extraction electrodes, in a direction along which the deviation angle is reduced, until the deviation angle measured in said deviation angle measuring control is within the threshold allowable range.

6. An ion implanting apparatus according to claim 5, wherein, when, with respect to the design beam orbit which extends from said ion source to said analysis slit through an arcuate orbit in said analysis electromagnet in the XZ plane, a side toward a center of the arc is referred to as an inner side, and a side opposite to the inner side is referred to as an outer side, said first extraction electrode is located in the inner side, and said second extraction electrode is located in the outer side, and, in the potential difference adjusting control, said controlling device adjusts the potential difference so that, when the deviation angle is an angle in the outer side with respect to the design beam orbit, a potential of said second extraction electrode is higher than a potential of said first extraction electrode, and, when the deviation angle is an angle in the inner side with respect to the design beam orbit, the potential of said first extraction electrode is higher than the potential of said second extraction electrode.

7. An ion implanting apparatus including:
an ion source from which, in a case where a design traveling direction of an ion beam is set as a Z direction, and two directions that are substantially perpendicular to each other in a plane that is substantially perpendicular to the Z direction are set as X and Y directions, respectively, a ribbon-like ion beam in which a dimension in the Y direction is larger than a dimension in the X direction is extracted, said ion source including:
a plasma generating chamber in which a plasma is generated;
an extraction electrode system which extracts an ion beam from the plasma in said plasma generating chamber by a function of an electric field, which has a plurality of electrodes in an ion beam extraction direction, and which some of said electrodes are set to a negative potential having an absolute value of 10 kV or higher with respect to a potential of said plasma generating chamber, an extraction electrode which is closest to the plasma is dividedly configured by first and second extraction electrodes which are on both sides of a path of the ion beam in the X direction; and
a magnet which applies a magnetic field that extends along the Y direction into said plasma generating chamber;
said ion implanting apparatus further including:
an analysis electromagnet which, in an XZ plane, bends the ion beam extracted from said ion source by a magnetic field to perform a momentum analysis;
a DC analysis electromagnet power supply which supplies to said analysis electromagnet an analysis electromagnet current that energizes said analysis electromagnet;
an analysis slit which is disposed downstream of said analysis electromagnet to cooperate with said analysis electromagnet to perform a momentum analysis of the ion beam;
a voltage-variable DC power supply which can form a potential difference between said first and second extraction electrodes a camera which takes an image of the ion beam in the XZ plane in a region from said analysis slit to an upstream side of said analysis slit, and which outputs data of the image, and a rear-stage beam instrument which receives the ion beam that has passed through said analysis slit, to measure a current of the ion beam; and a controlling device which performs one or more times: (a) an analysis electromagnet current adjusting control where said analysis electromagnet power supply is controlled to adjust the analysis electromagnet current so that the beam current measured by said rear-stage beam instrument is maximum; (b) a deviation angle measuring control where the image data from said camera are processed to obtain a deviation angle of an actual beam orbit of the ion beam entering said analysis slit from a design beam orbit in the XZ plane; and (c) a potential difference adjusting control where it is determined whether the deviation angle measured in said deviation angle measuring control is within a threshold allowable range or not, and, if not within the allowable range, said DC power supply is controlled to adjust the potential difference so that, when the ion beam leaves said extraction electrode system, the ion beam is bent by the potential difference between said first and second extraction electrodes, in a direction along which the deviation angle is reduced, until the deviation angle measured in said deviation angle measuring control is within the threshold allowable range.

8. An ion implanting apparatus according to claim 7, wherein, when, with respect to the design beam orbit which extends from said ion source to said analysis slit through an arcuate orbit in said analysis electromagnet in the XZ plane, a side toward a center of the arc is referred to as an inner side, and a side opposite to the inner side is referred to as an outer side, said first extraction electrode is located in the inner side, and said second extraction electrode is located in the outer side, and, in the potential difference adjusting control, said controlling device adjusts the potential difference so that, when the deviation angle is an angle in the outer side with respect to the design beam orbit, a potential of said second extraction electrode is higher than a potential of said first extraction electrode, and, when the deviation angle is an angle in the inner side with respect to the design beam orbit, the potential of said first extraction electrode is higher than the potential of said second extraction electrode.

* * * * *